(12) United States Patent
Juengling

(10) Patent No.: US 7,573,088 B2
(45) Date of Patent: Aug. 11, 2009

(54) DRAM ARRAY AND ELECTRONIC SYSTEM

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 105 days.

(21) Appl. No.: 11/695,407

(22) Filed: Apr. 2, 2007

(65) Prior Publication Data

US 2007/0181929 A1 Aug. 9, 2007

Related U.S. Application Data

(62) Division of application No. 11/168,699, filed on Jun. 27, 2005, now Pat. No. 7,459,362.

(51) Int. Cl.
*H01L 29/94* (2006.01)

(52) U.S. Cl. ............... 257/306; 257/E29.345; 438/253; 438/396

(58) Field of Classification Search .............. 257/306, 257/E29.345; 438/253, 396
See application file for complete search history.

(56) References Cited

U.S. PATENT DOCUMENTS

| 6,025,624 | A | 2/2000 | Figura | |
|---|---|---|---|---|
| 6,914,286 | B2 * | 7/2005 | Park | 257/304 |
| 7,188,038 | B2 * | 3/2007 | Picollet et al. | 702/65 |
| 7,300,841 | B2 * | 11/2007 | Park | 438/254 |
| 2001/0000492 | A1 * | 4/2001 | Figura | 438/256 |
| 2003/0085420 | A1 * | 5/2003 | Ito et al. | 257/309 |
| 2005/0051822 | A1 * | 3/2005 | Manning | 257/296 |
| 2005/0082586 | A1 * | 4/2005 | Tu et al. | 257/296 |
| 2006/0121672 | A1 * | 6/2006 | Basceri et al. | 438/243 |

FOREIGN PATENT DOCUMENTS

DE 19639899 A1 4/1998

* cited by examiner

*Primary Examiner*—Douglas M Menz
*Assistant Examiner*—Steven J Fulk
(74) *Attorney, Agent, or Firm*—Wells St. John P.S.

(57) ABSTRACT

The invention includes a semiconductor construction including rows of contact plugs, and rows of parallel bottom plates. The plug pitch is approximately double the plate pitch. The invention includes a method of forming a semiconductor construction. A plurality of conductive layers is formed over the substrate, the plurality of layers being substantially orthogonal relative to first, second and third rows of contact plugs. An opening is etched which passes through each of the conductive layers within the plurality of conductive layers. The opening is disposed laterally between the first and second row of contact plugs. After etching the opening a dielectric material is deposited over the plurality of conductive layers and a second conductive material is deposited over the dielectric material. The invention includes an electronic system including a processor and a memory operably associated with the processor. The memory device has a memory array which includes double-pitched capacitors.

11 Claims, 36 Drawing Sheets

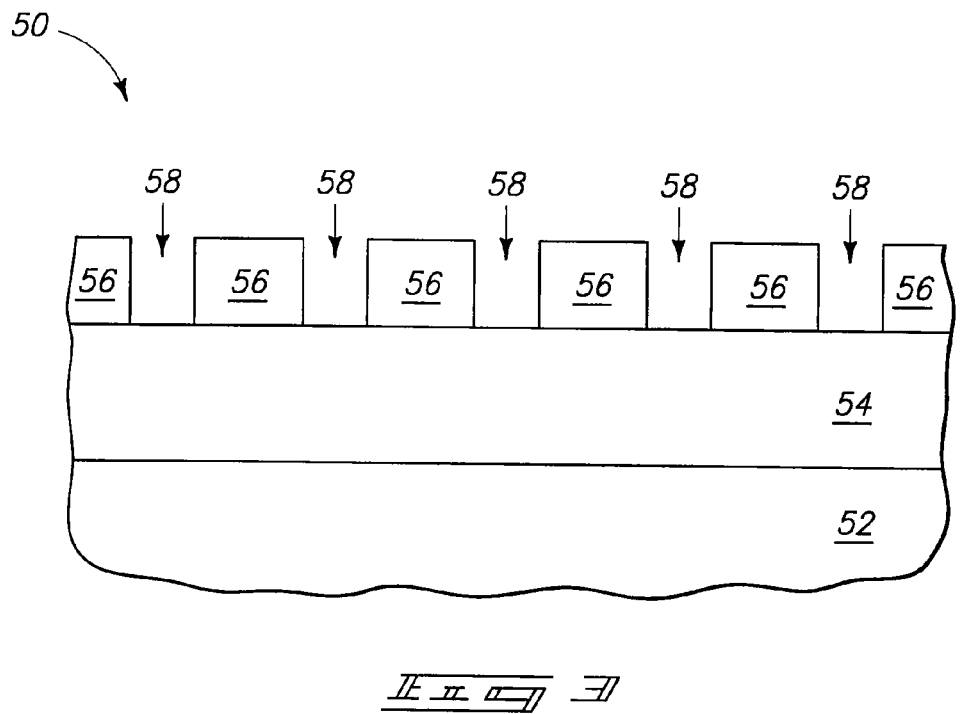
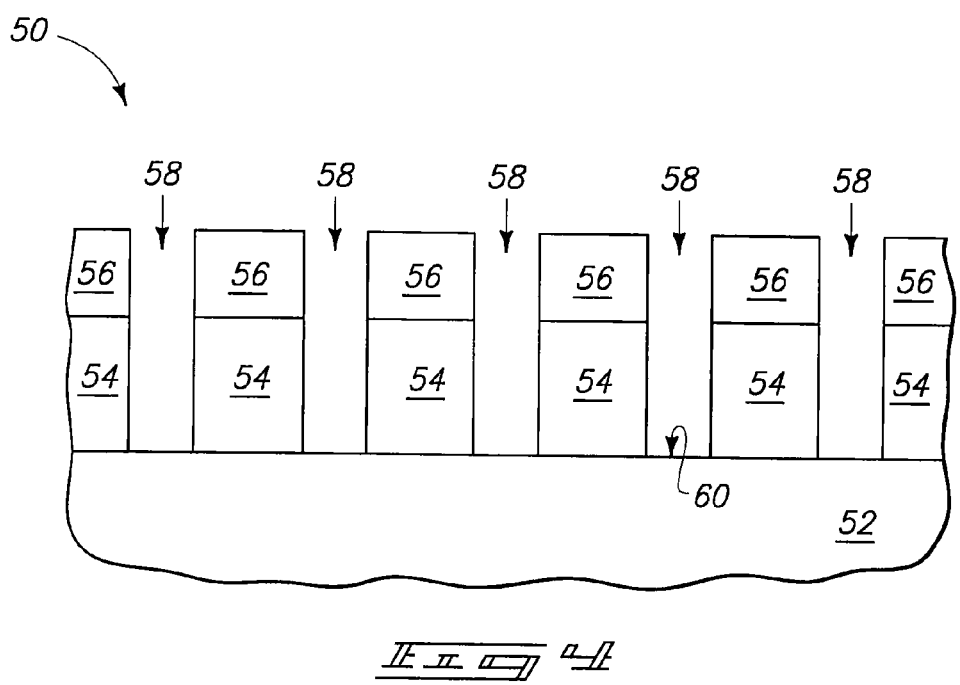

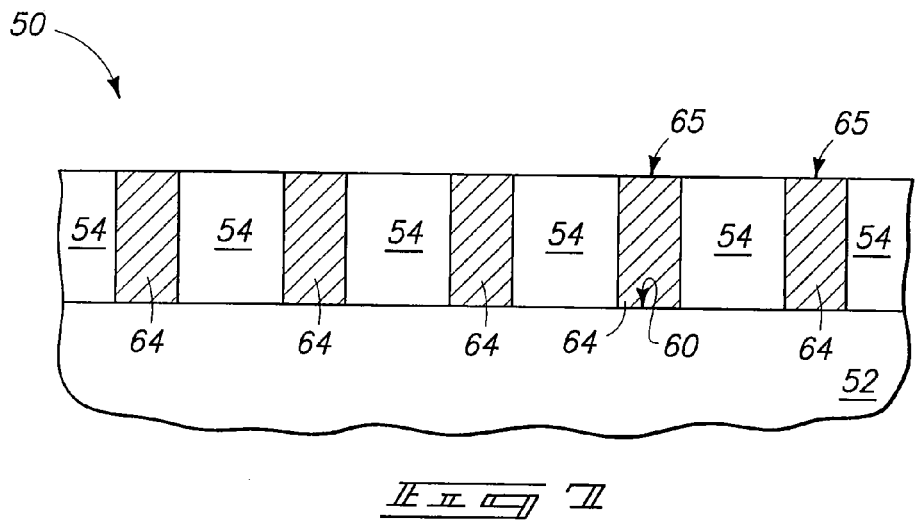
$\mathbb{H} = \mathbb{Z} \quad \mathbb{Z}$
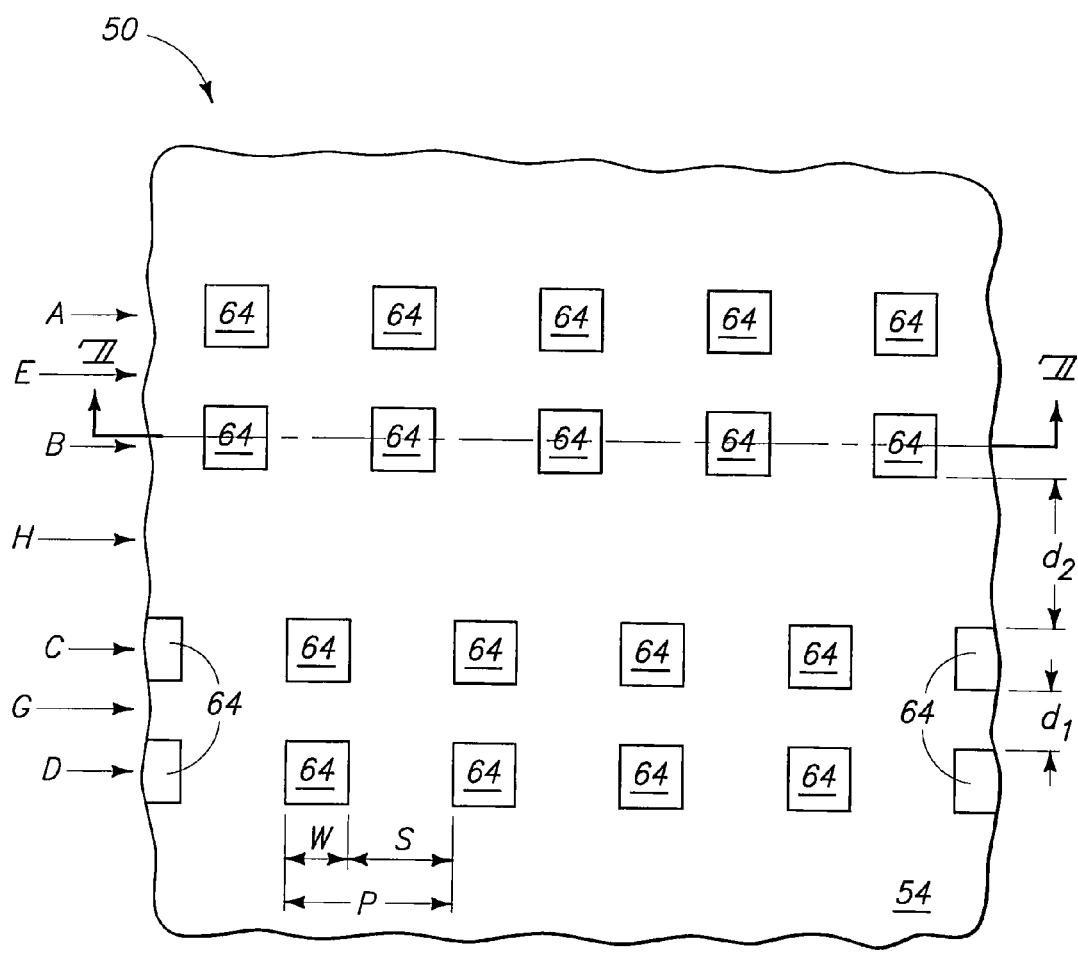
$\mathbb{H} = \mathbb{Z} \quad \mathbb{B}$

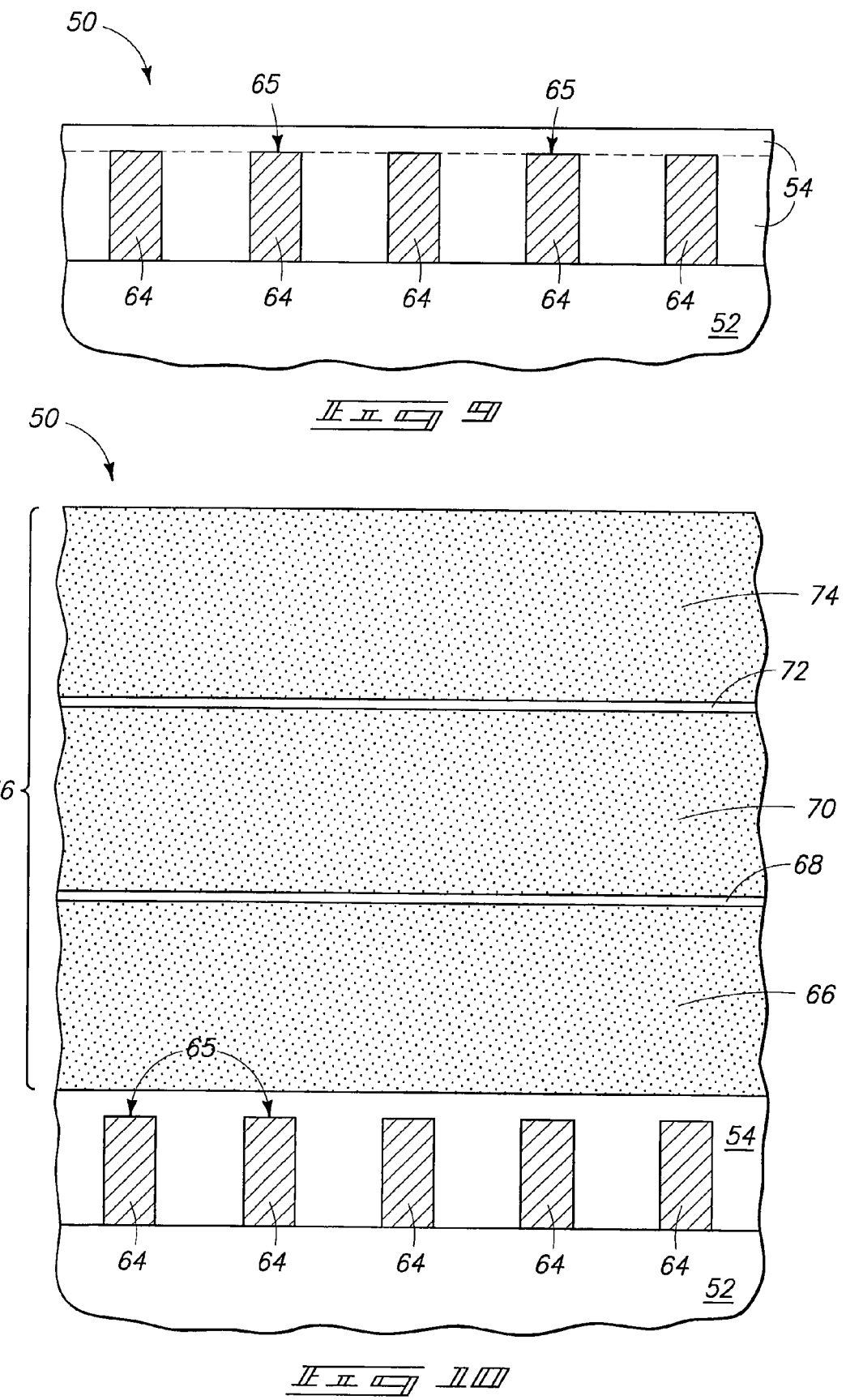

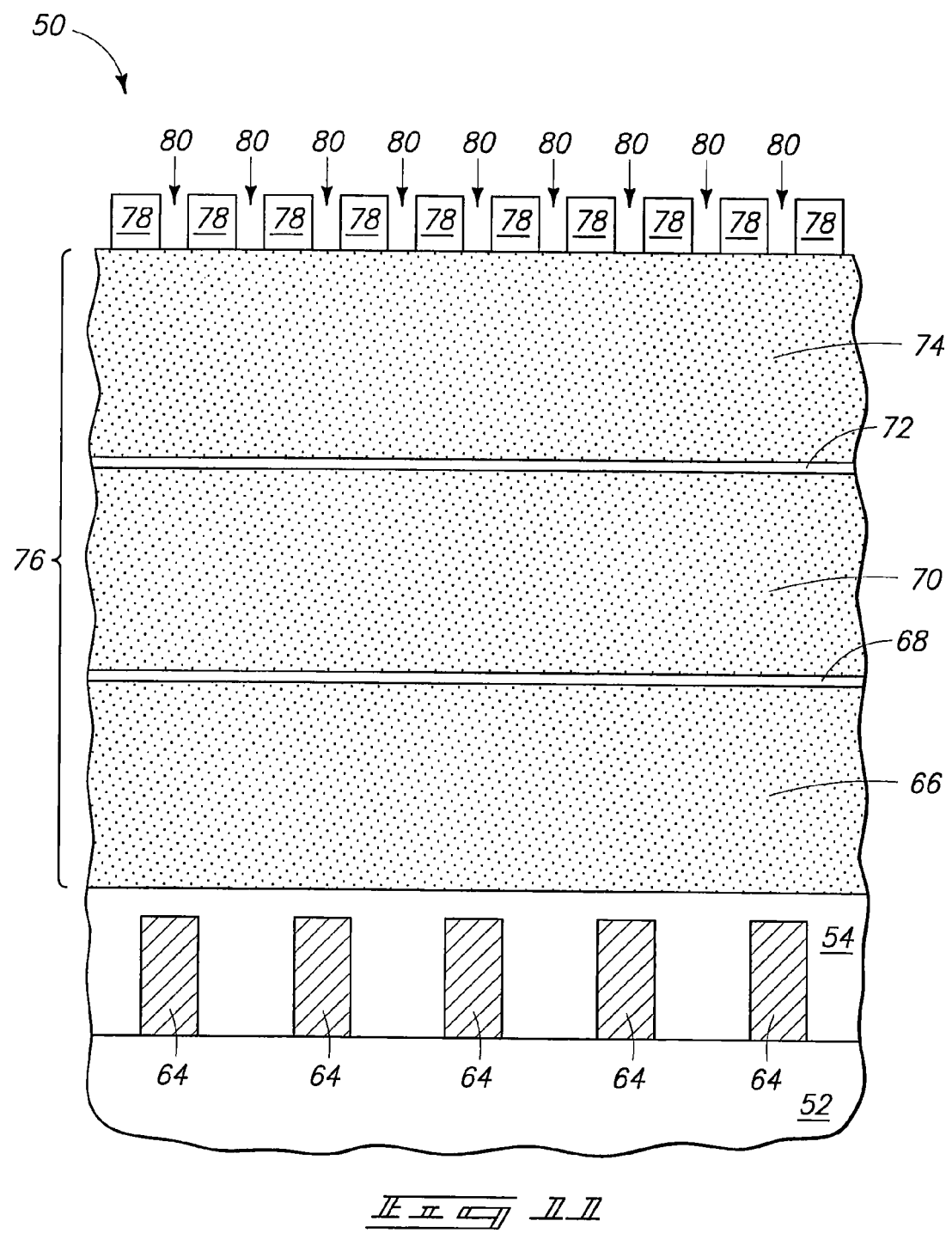

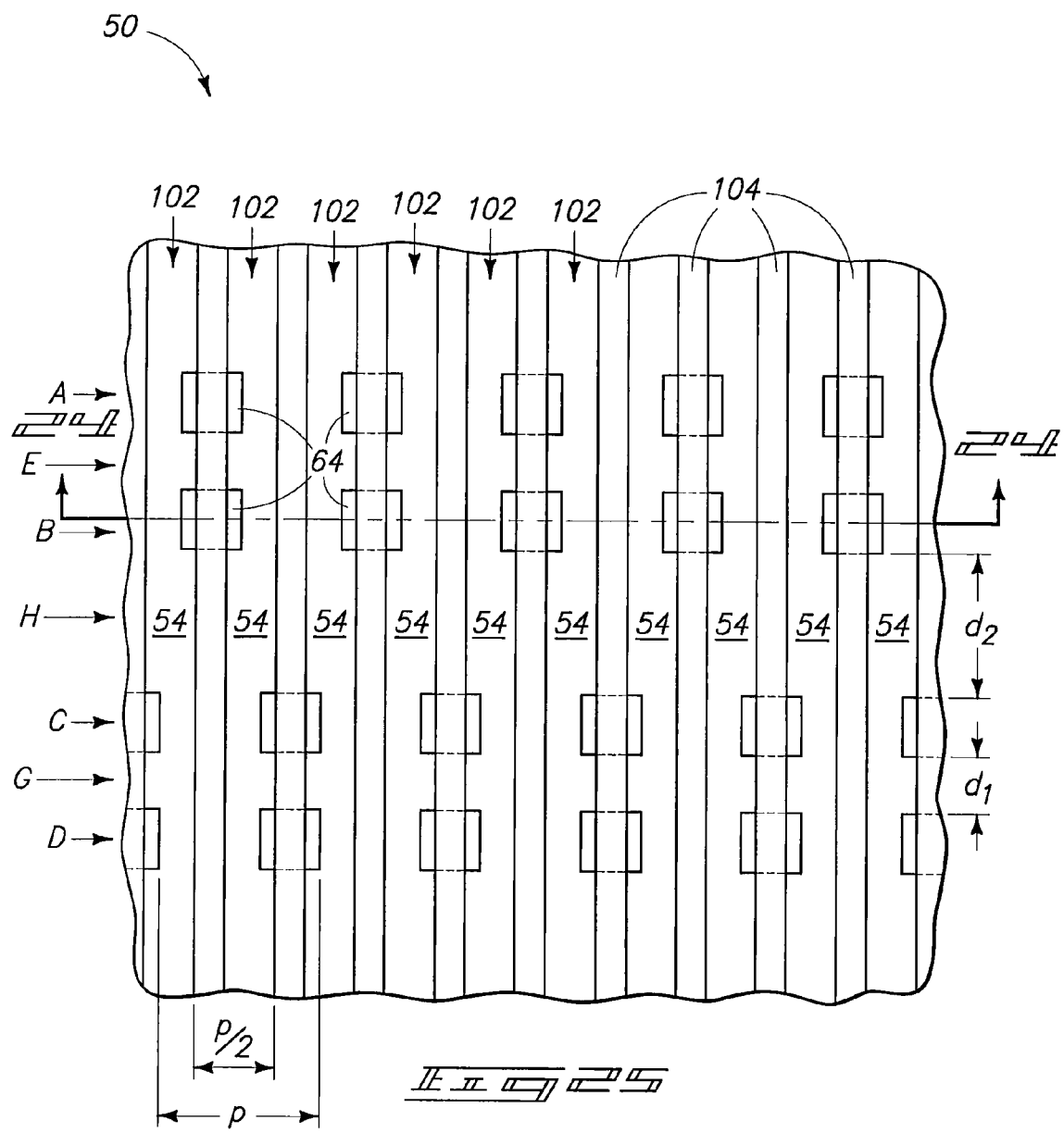

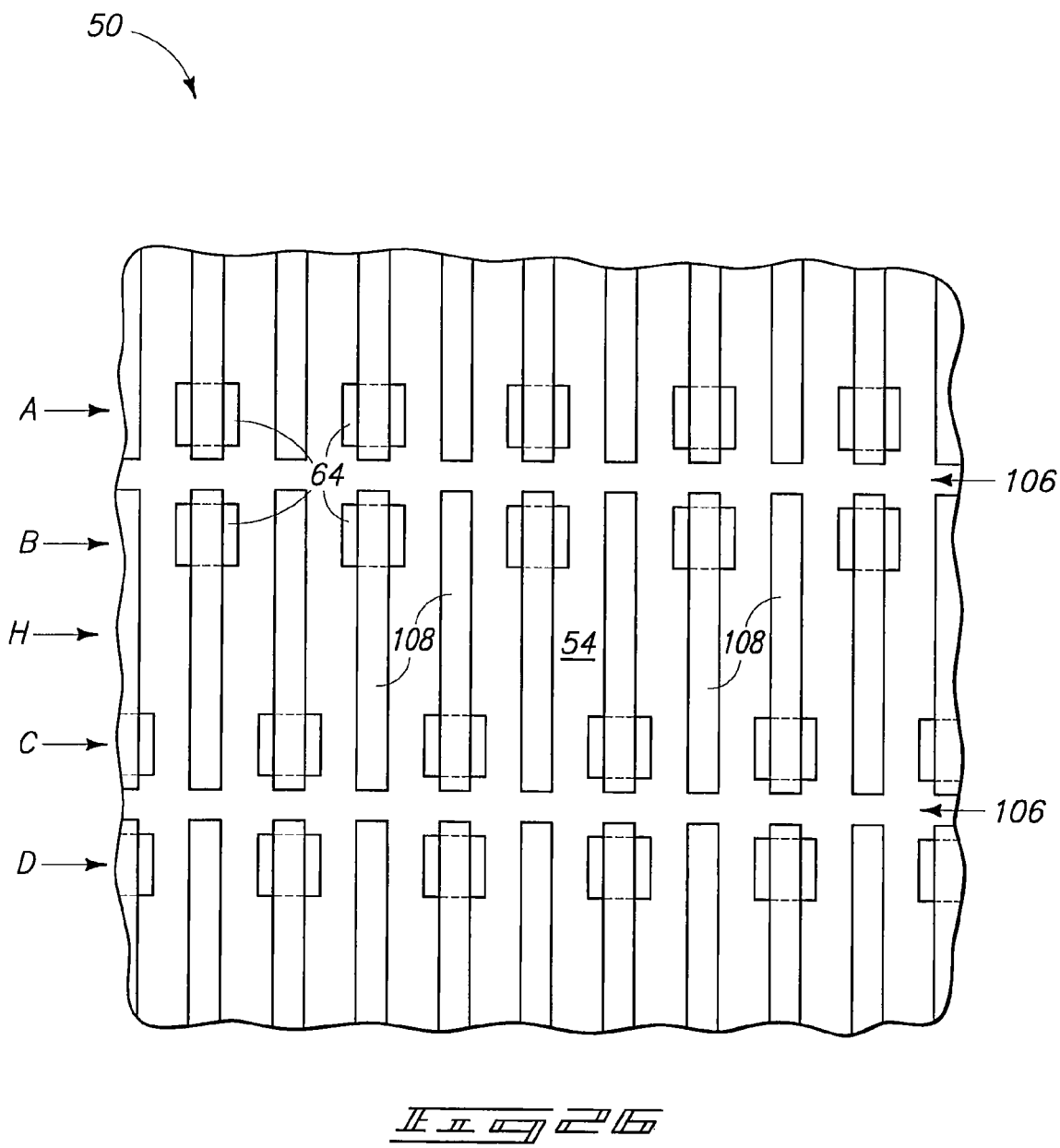

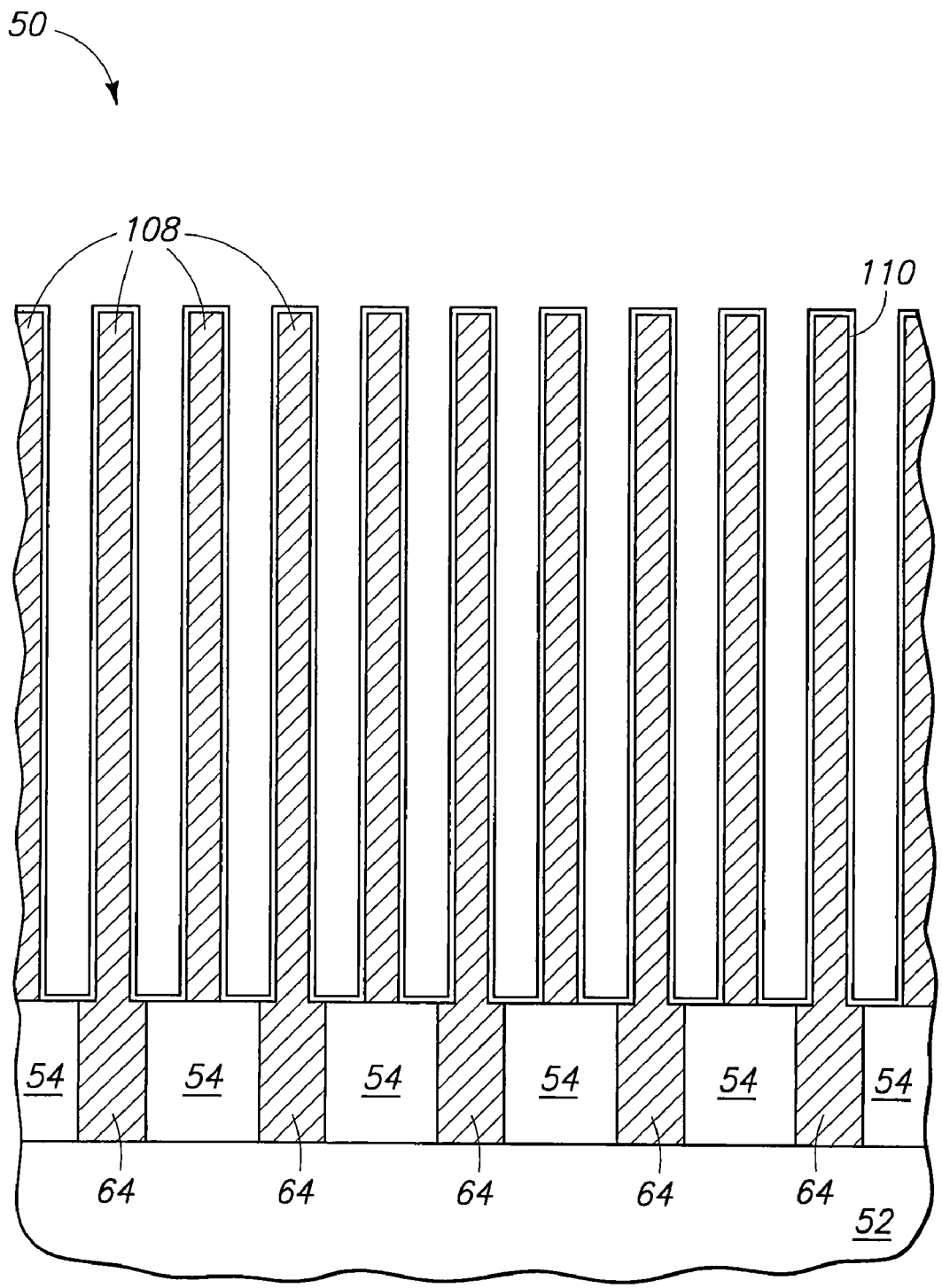
F i g 2 7

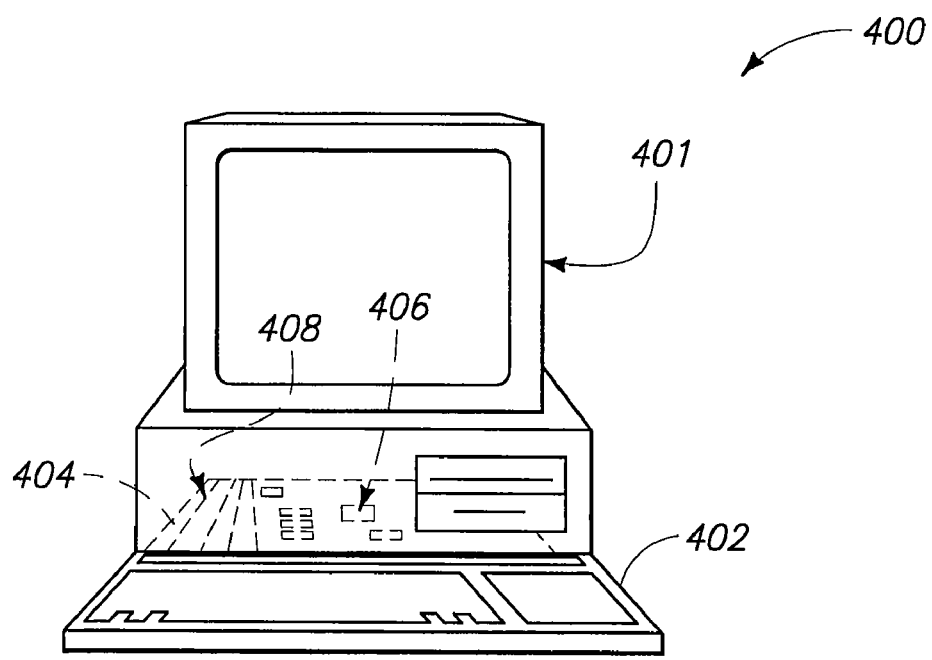
_FIG. 39_
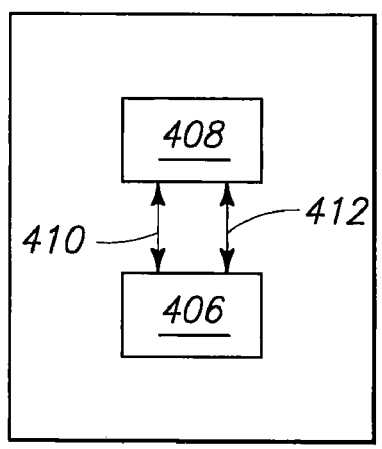
_FIG. 40_

DRAM ARRAY AND ELECTRONIC SYSTEM

RELATED PATENT DATA

This patent resulted from a divisional application of U.S. patent application Ser. No. 11/168,699 which was filed on Jun. 27, 2005.

TECHNICAL FIELD

The invention pertains to semiconductor constructions, dynamic random access memory (DRAM) arrays, memory cells and electronic systems. The invention additionally pertains to methods of forming memory arrays and methods of forming semiconductor constructions.

BACKGROUND OF THE INVENTION

The reduction in memory cell and other circuit feature sizes for high density dynamic random access memories (DRAMs) and other circuitry is a continuing goal in semiconductor fabrication. DRAM devices comprise arrays of memory cells each of which contains an access transistor and a capacitor. Areas within a DRAM in which electrical connections are made (i.e. between the capacitors and transistors) are generally referred to as active areas. The active areas within a memory array typically weave across the array in a serpentine manner in a substantially horizontal direction (see FIG. 2). Bit lines within the array typically also weave horizontally across the array in an opposing serpentine manner relative to the active areas, with wordlines of the array running substantially orthogonally relative to the active areas and bitlines.

In conventional memory cell and DRAM construction, capacitors are typically formed to conform to the serpentine weave of the active regions. Masking and etching processes for producing such conventional capacitor constructions can be problematic, especially at the minimum photolithographic dimensions for high density DRAM arrays. Accordingly, it is desirable to develop alternative capacitor constructions and methodology for production of alternative capacitor constructions.

SUMMARY OF THE INVENTION

In one aspect the invention encompasses a semiconductor construction including a first contact plug and a second contact plug, and having a first bottom plate and a second bottom plate. The second contact plug has a plug width in a first direction and is spaced from the first contact plug by a first distance along a first direction. The sum of the first distance and the plug width define a plug pitch. The first bottom plate is in electrical contact with the first contact plug and has a plate width in the first direction. The first and second bottom plates are spaced relative to each other by a second distance in the first direction. The sum of the second distance and the plate width define a plate pitch. The plug pitch is approximately double the plate pitch.

In one aspect the invention encompasses a semiconductor construction having a contact plug with a first bottom plate in electrical contact with an upper surface of the contact plug. The bottom plate extends vertically upward to a first elevation relative to the upper surface. The construction includes a second bottom plate spaced from the first bottom plate by a distance, and has an insulative support structure spanning the distance between the first and second bottom plates at a second elevation between the upper surface and the first elevation.

In one aspect the invention encompasses a DRAM array including a first row of contact plugs and a second row of contact plugs spaced from the first row of contact plugs by a first distance. The array additionally includes a third row of contact plugs spaced from the second row of contact plugs by a second distance which is greater than the first distance. A first plurality of bottom plates is present in the array with each bottom plate being in electrical contact with a single contact plug within the second row of contact plugs, each bottom plate spanning the second distance.

In one aspect the invention encompasses a memory cell including a transistor coupled to a capacitor having a single vertical bottom plate in electrical connection to a contact plug within a substrate. The single vertical bottom plate is horizontally aligned between a first bottom plate of a first adjacent capacitor and a second bottom plate of a second adjacent capacitor. The single vertical bottom plate passes between a first adjacent contact plug associated with the first adjacent capacitor and a second adjacent contact plug associated with the second adjacent capacitor.

In one aspect the invention encompasses a method of forming a memory array including providing a plurality of contact plugs within a substrate, where the plugs are arranged in a first row and a second row separated from the first row by a gap. A row of individual capacitor plates is formed which are substantially parallel relative to each other and span the gap. The row of capacitor plates includes a first set and a second set of capacitor plates. Each member of the first set is associated with a contact plug in the first row and each member of the second set is associated with a contact plug in the second row. The capacitor plates of the second set are each interposed between members of the first set.

In one aspect the invention encompasses a method of forming a DRAM array including forming a plurality of contact plugs in a substrate such that the plurality of plugs includes a first row and a second row separated from the first row by a first distance, and a third row separated from the second row by a second distance where the second distance is greater than the first distance. The first, second and third rows of plugs are substantially parallel. The method includes forming a plurality of conductive layers substantially orthogonal relative to the first, second and third rows of plugs. Each of the conductive layers extends across a first, second and third rows. Openings are formed through each of the conductive layers between the first and second row of plugs to form a plurality of individual conductive plates that span the second distance between the second and third row of plugs.

In one aspect the invention encompasses a method of forming a semiconductor construction. The method includes providing a substrate having a first, a second and a third row of contact plugs. A plurality of conductive layers are formed over the substrate, the plurality of layers being substantially orthogonal relative to the first, second and third rows. The plurality of conductive layers consists of a first set of conductive layers and a second set of conductive layers. The first set of conductive layers are each electrically contacting an individual contact plug comprised by the third row and electrically isolated from contact plugs comprised by the first and second rows. The second set of conductive layers is each electrically contacting a contact plug in the first row and a contact plug in the second row. An opening is etched which passes through each of the conductive layers within the plurality of conductive layers. The opening is disposed laterally between the first and second row of contact plugs. After etching the opening a dielectric material is deposited over the plurality of conductive layers and a second conductive material is deposited over the dielectric material.

In one aspect the invention encompasses an electronic system including a processor and a memory device operably associated with the processor. The memory device has a memory array which includes a first row of contact plugs, a second row of contact plugs spaced from the first row of contact plugs by a first distance, and a third row of contact plugs spaced from the second row of contact plugs by a second distance which is greater than the first distance. The array additionally includes a plurality of bottom capacitor plates which span the second distance. Each of the contact plugs comprised by the second row of plugs is electrically connected to a single of the bottom capacitor plates.

BRIEF DESCRIPTION OF THE DRAWINGS

Preferred embodiments of the invention are described below with reference to the following accompanying drawings.

FIG. 3 is a schematic cross-sectional view of a semiconductor wafer fragment at a preliminary processing stage in accordance with one aspect of the present invention.

FIG. 4 is a view of the FIG. 3 wafer fragment at a processing stage subsequent to that of FIG. 3.

FIG. 7 is a view of the FIG. 3 wafer fragment at a processing stage subsequent to that of FIG. 6.

FIG. 8 is a top view of the FIG. 3 wafer fragment at the processing stage depicted in FIG. 7. The cross-section shown in FIG. 7 is taken along line 7-7 of FIG. 8.

FIG. 9 is a cross-sectional side view of the FIG. 3 wafer fragment at a processing stage subsequent to that of FIG. 7.

FIG. 10 is a view of the FIG. 3 wafer fragment at a processing stage subsequent to that of FIG. 9.

FIG. 11 is a view of the FIG. 3 wafer fragment at a processing stage subsequent to that of FIG. 10.

FIG. 25 is a top view of the FIG. 24 wafer fragment with the view shown in FIG. 24 being taken from line 24-24.

FIG. 26 is a top view of the FIG. 3 wafer fragment at a processing stage subsequent to that of FIG. 25.

FIG. 27 is a cross-sectional side view of the FIG. 3 wafer fragment at a processing stage subsequent to that of FIG. 26.

FIG. 39 is a diagrammatic view of a computer illustrating an exemplary application of the present invention.

FIG. 40 is a block diagram showing particular features of the mother board of the FIG. 39 computer.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
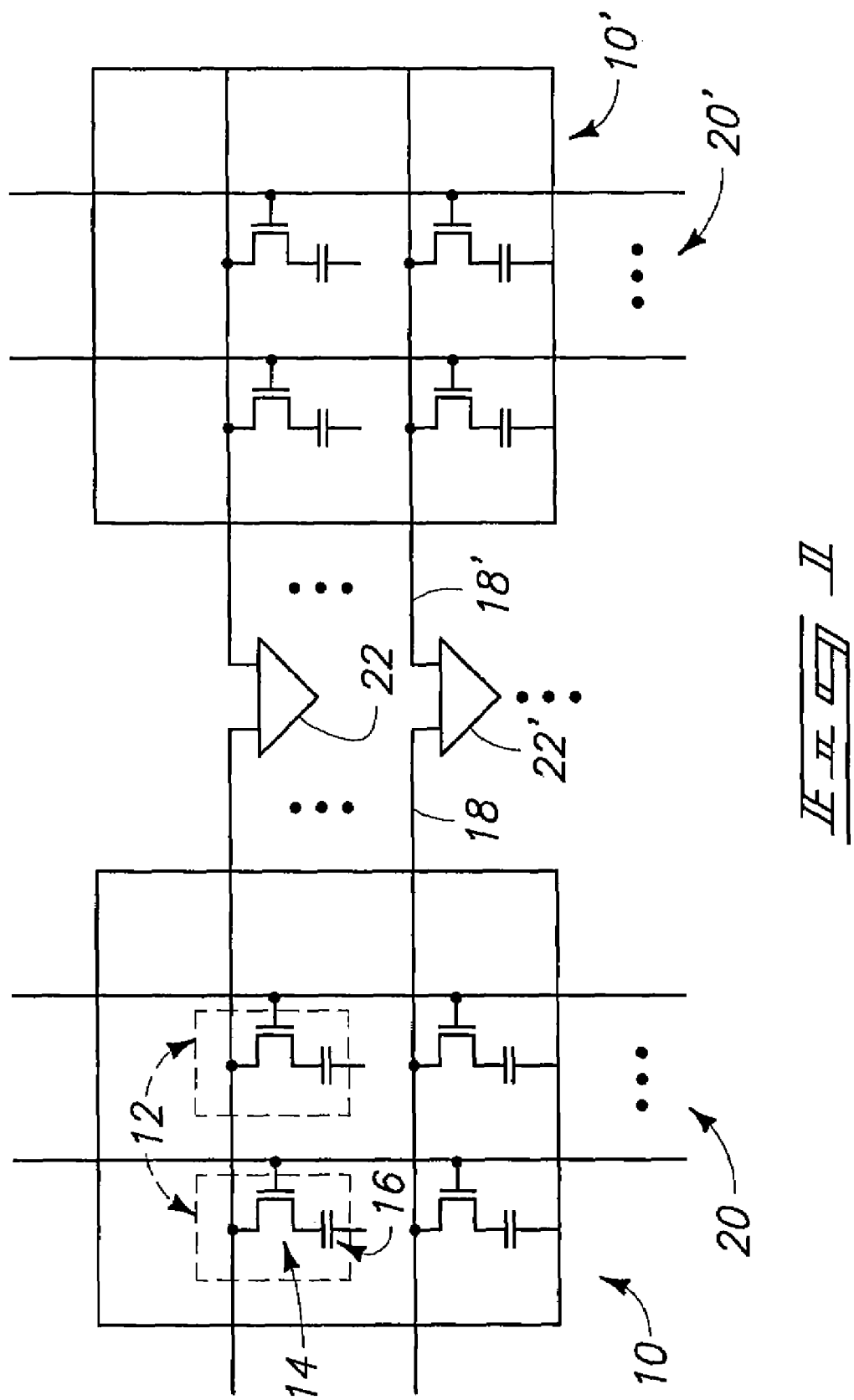
FIG. 1 is a simplified schematic diagram depicting an exemplary pair of memory arrays in accordance with the prior art.

Referring to FIG. 1, a simplified schematic diagram is depicted describing a pair of memory arrays 10, 10' each of which employ a memory cell 12 including an access transistor 14 and a capacitor 16 in accordance with conventional technology. It will be appreciated that other types of access devices can be utilized in place of the transistor depicted.

Memory arrays 10, 10' are each coupled to respective bit lines 18, 18' and respective wordlines 20, 20'. The bit lines are shown coupled to sense amplifiers 22, 22'. The sense amplifiers can comprise peripheral circuitry generally formed outside the peripheries of the memory arrays 10, 10' and which can include circuitry employed in support of memory arrays 10, 10'.

Figure 2:
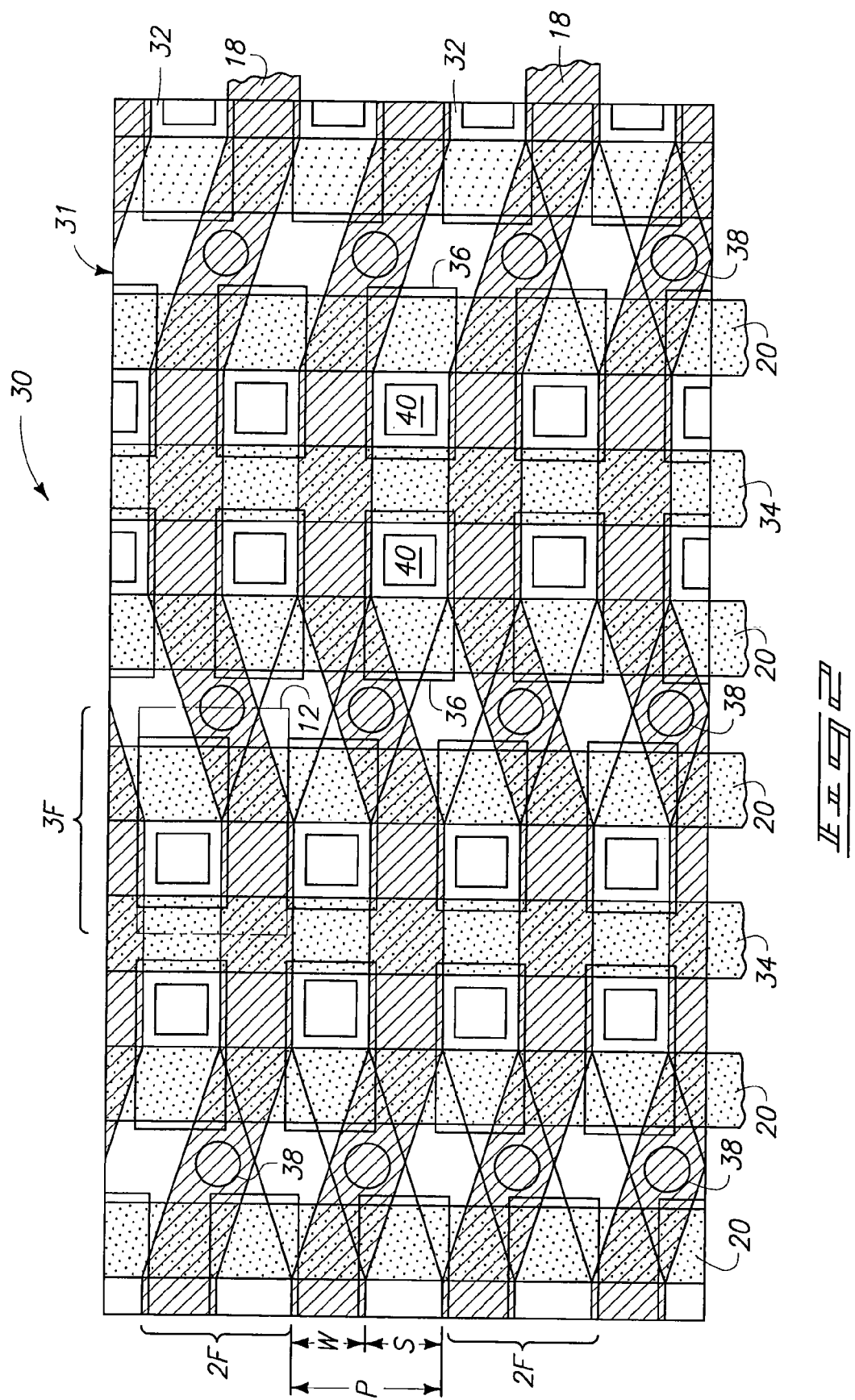
FIG. 2 is a simplified plan view of a circuit layout for an exemplary 6 $F^2$ memory array.

Referring to FIG. 2, such shows a simplified view of a portion of a circuit layout for a 6 $F^2$ memory array 30, including a semiconductive substrate 31. To aid in interpretation of the claims that follow, the terms "semiconductive substrate"

and "semiconductor substrate" are defined to mean any construction comprising semiconductive material including, but not limited to, bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates described above.

A plurality of continuous active areas 32 are formed relative to substrate 31. For purposes of clarity, each illustrated continuous active area has been shown to extend outside the boundary of substrate 31. Continuous active areas 32 are typically non-linear, following a serpentine path across the memory array. The illustrated individual continuous active areas extend generally horizontally across the page upon which FIG. 2 appears, and bend or jog upwardly as depicted in FIG. 2. A plurality of buried bit lines 18 are shown as hatched areas extending generally horizontally across array 30. Each bitline also follows a serpentine path across memory array 30, with the serpentine weave of the bitlines being in the opposite direction relative to the weave of the active areas.

A plurality of conductive lines 20, 34 is formed over substrate 31 relative to active areas 32. In the illustrated example, six of the conductive lines are designated with numeral 20, and two of the conductive lines are designated with the numeral 34. A pair of conductive lines 20 can be seen on either side of conductive line 34. Conductive lines 20 and 34 run generally vertically as viewed in FIG. 2 (substantially orthogonally relative to the general horizontal direction of the active areas).

Active areas 32 and conductive lines 20, 34 constitute or define an array over which a plurality of memory cells will be formed. In particular instances and as described in the exemplary aspects of the present invention, the array can constitute a dynamic random access memory (DRAM) array.

Individual areas which are consumed by single memory cells in accordance with the depicted memory array are illustrated by a dashed outline designated numeral 12. Such area can be considered or described as relative to a dimension "F". In the illustrated example, F equals one-half of the "minimum pitch" of the memory array. The term "pitch" as used in this document is intended to be in its conventional usage, and is defined as the distance between one edge of a device or feature and the corresponding same edge of the next adjacent device or feature. Accordingly, with respect to the depicted memory array 12, the term "minimum pitch" will be about equal to the smallest distance of a line width (such as lines 20, 24) plus the width of a space immediately adjacent the line on one side of the line between the line and the next adjacent line in a repeated pattern within the array. As shown, a single memory cell is about 3 F wide by about 2 F deep, thus providing a consumed area for a single memory cell of about 6 $F^2$.

In exemplary implementations of conventional memory arrays such as that depicted in FIG. 2, selected individual conductive lines can provide electrical isolation relative to adjacent memory cells. For instance, as depicted exemplary lines 20 serve as wordlines relative to individual memory cells 12. Electrical isolation between adjacent pairs of memory cells is provided by intervening conductive line 34 which in operation can be connected with ground or a suitable negative voltage. Alternatively, field oxide isolation techniques can be utilized.

The memory array 30 depicted in FIG. 2 additionally includes capacitor containers 36 represented as rectangles and bit line contacts 38 represented as circles. Container capacitors can typically be formed within capacitor containers 36 and are coupled to active areas via storage node contacts 40. In particular aspects, the storage node contacts can comprise a conductive material which extends to a node portion of an active area.

While the access device 14 from FIG. 1 is not explicitly shown in FIG. 2, such access device can include a bit line contact 38, and adjacent wordline 20 and an adjacent storage node contact 40.

It is noted with reference to FIG. 2 that the conventional capacitor containers 36 depicted have a pitch substantially equivalent to the memory cell pitch. In other words, the width of each capacitor container (in a vertical direction on the page) plus the width of the space between immediately adjacent capacitor containers (in a vertical direction on the page) is substantially equivalent to the pattern pitch 'P', where P corresponds to the line width 'W' plus the width of the space 'S' immediately adjacent the line as depicted in FIG. 2. In contrast, methodology of the invention can be utilized to produce a capacitor pattern such that the capacitor pitch is approximately equivalent to half the pitch of the memory array pattern. The methodology described below allows production of capacitors having high capacitance in small areas. Constructions in accordance with the invention can be memory cells, for example, DRAM cells or memory arrays having 6 $F^2$ cell layouts. It is to be understood however that the invention contemplates adaptation for utilization of techniques and constructions in accordance with the invention for alternative cell pattern layouts such as for example, 4 $F^2$ or 8 $F^2$ layouts.

Methodology and resulting construction formed in accordance with the invention is described generally with reference to FIGS. 3-38. The described methodology can be utilized to produce storage node plates and capacitors in place of the full pitch capacitors depicted in FIG. 2. Although the invention is described without specific depiction and reference to each of the features of the array depicted in FIG. 2, it is to be understood that constructions and methodology in accordance with the invention can include features as described above with respect to FIG. 2, replacing the conventional exemplary depicted container type capacitor with capacitors in accordance with the present invention. For ease of description and clarity, additional features present in the array shown in FIG. 2 are not repeated in each of the figures describing methodology of the invention.

Referring initially to FIG. 3, a wafer fragment 50 is depicted generally having a substrate 52 with a layer of insulative material 54 formed thereover. A patterned masking material 56 is formed over material 54 such that patterned mask 56 has a plurality of openings 58 therein. Insulative material 54 can be, for example, an appropriate oxide or nitride material, and in particular instances will comprise silicon nitride. Patterned mask 56 can be formed, for example, by depositing a mask material such as photoresist over insulative layer 54, and patterning the mask material by, for example, utilization of photolithographic patterning techniques to form blocks having opening 58 therebetween. The patterning of the masking material layer provides a single mask which defines a plurality of patterned openings 58 arranged to define a pattern of contact openings.

Referring to FIG. 4, contact openings are etched or otherwise formed by extending the openings in the patterned mask through insulative material 54 to expose substrate surface 60 corresponding to active area portions of the substrate. Typically, substrate 52 will comprise buried bit lines (not shown) having bit line contacts formed in substrate processing prior to formation of the openings 58 such that openings 58 will be utilized specifically for capacitor contact openings.

Figure 5:
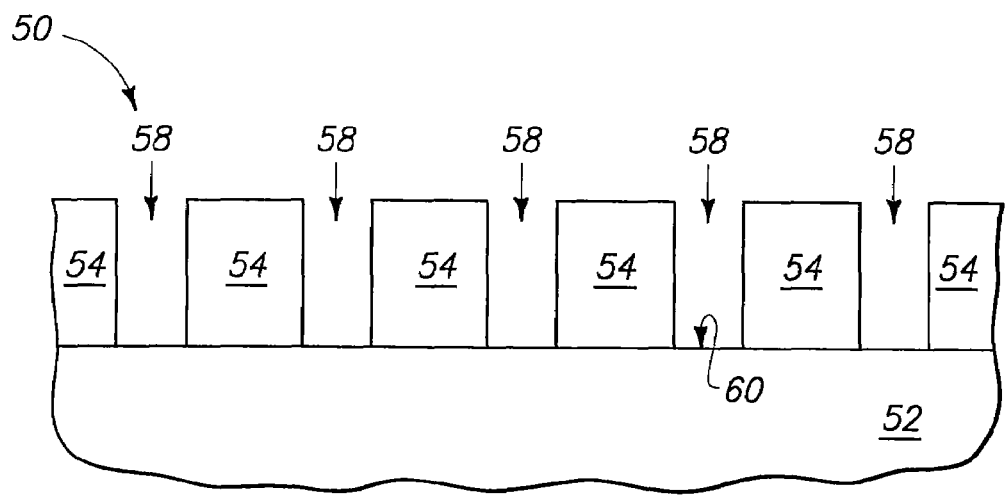
FIG. 5 is a view of the FIG. 3 wafer fragment at a processing stage subsequent to that of FIG. 4.
Figure 6:
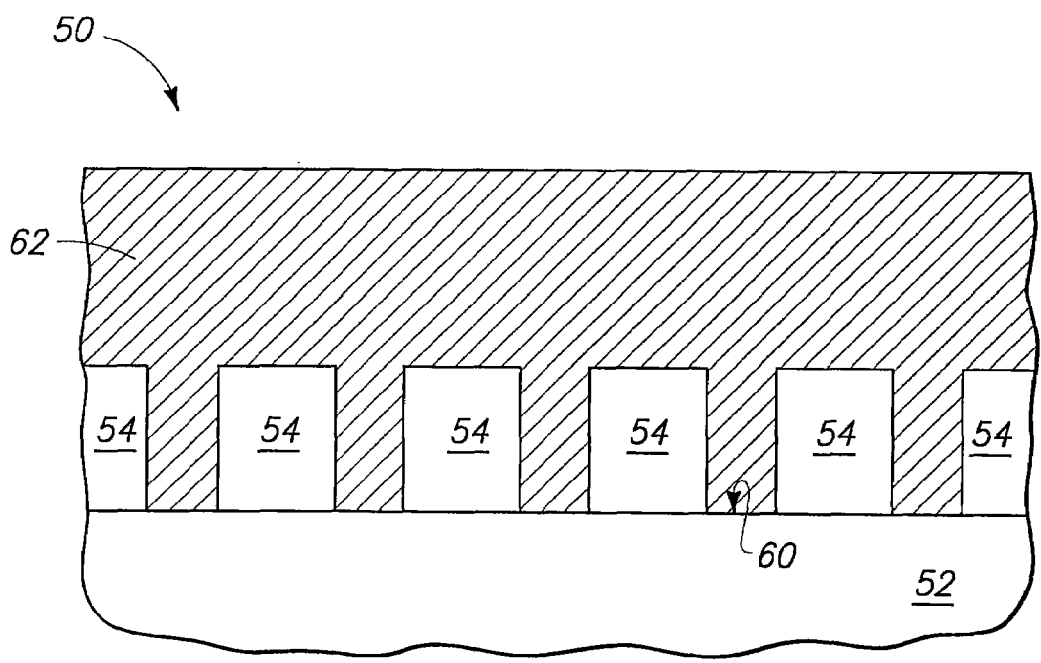
FIG. 6 is a view of the FIG. 3 wafer fragment at a processing stage subsequent to that of FIG. 5.

Referring to FIG. 5, mask material 56 is removed by, for example, resist stripping. Referring to FIG. 6, a layer 44 of conductive material is formed over substrate 52. Preferably, layer 44 is formed within both the capacitor contact openings and over an upper surface of insulative layer 54. Such material is preferably in electrical communication with associated active area portions at the base of each opening. Exemplary materials for layer 62 include conductively doped polysilicon.

Referring to FIG. 7, material of layer 62 is removed to a degree sufficient to isolate conductive material plugs 64 within the openings formed in first insulative material 54. The removal of material from layer 62 can be accomplished by any suitable method which is effective to isolate the plugs 64 as illustrated. Such methodology can include, for example, a resist etch-back, a timed etch, or planarization relative to upper surface of insulative material 54. In accordance with a preferred aspect of the invention, material of layer 62 is selectively removed to a degree sufficient to form upper surfaces 65 of plug 64 to be substantially planar with upper surface of material 54.

Referring next to FIG. 8, such depicts a top view of array 50 at the processing stage depicted in FIG. 7. The cross-sectional view shown in FIG. 7 is taken along line 7-7 of FIG. 8. The illustrated alignment of plugs 64 shown in the top view is a preferred layout. The fragmentary view shown illustrates a first row of plugs 64 designated as row A and a second row of plugs designated as row B which is substantially parallel to row A and is separated from row A by a space or gap E. Each of the plugs present in row A is substantially aligned with a plug in row B in the vertical direction as shown on the page. The fragment shown also illustrates a third row designated row C and a fourth row designated row D separated from each other by a space or gap G. Rows C and D are preferably patterned to be substantially identical to rows A and B while having each of the plugs present in row C and D offset in a horizontal direction as shown on the drawing sheet relative to the plugs present in rows A and B. In a continuing portion of the pattern (not shown) a fifth and sixth row would be shifted relative to rows C and D such that plugs in the fifth and sixth row would be substantially vertically aligned with plugs present in the first and second rows A and B.

As illustrated in FIG. 8, the patterned plug layout can be described as having a plug pitch P defined as the sum of the width of a plug W in a first direction (horizontal as illustrated on the drawing sheet) and the distance S of a space between a given plug and an adjacent plug within the same row. In preferred embodiments, the horizontal shift of plugs present in rows C and D relative to those present in A and B is approximately one-half P (½-pitch shift).

As further illustrated in FIG. 8, plug spacing in a second direction (vertical on the drawing sheet) is narrower between adjacent rows of plugs having plugs that are substantially aligned (designated $d_1$) relative to a wider spacing designated $d_2$ corresponding to a space or gap H between adjacent rows having plugs offset relative to each other. Alternatively described, the plugs in first row A are separated from the plugs present in second row B in a first direction by distance $d_1$, and plugs present in third row C are separated from plugs present in second row B by a second distance $d_2$ in the first direction, where the first direction is represented as the vertical direction on the drawing sheet. Plugs present in third row C are aligned with and separated in the vertical direction from plugs present in fourth row D by distance $d_1$. In accordance with the preferred plug layout shown, the patterned mask and processing described above can preferably be performed to produce and maintain the half-pitch offset pattern depicted. It is to be understood however that the invention contemplates adaptation of the described methodology for utilization in alternative design patterns.

After patterning and plug formation, various alternate processing can be utilized to form capacitor structures in accordance with the invention. A first processing aspect is described with reference to FIGS. 9-22. Referring to FIG. 9, insulator material 54 can be increased to overlie plugs 64 by, for example, depositing additional insulative material over the array of plugs. The additional insulative material can be formed to a thickness of from about 100 angstroms to about 500 angstroms over upper surfaces 65 of the plugs and can be the same material utilized for lower regions of insulator 54 or can differ therefrom. Appropriate insulative materials include those insulative materials discussed above with respect to formation of initial material 54.

Referring to FIG. 10 an insulative material 76 is formed over the plug array of wafer fragment 50. Insulative material 76 can comprise a composite of material layers 66, 68, 70, 72 and 74 as depicted in FIG. 10 or can alternatively comprise a single layer comprising one or more insulative materials (not shown). Where insulative material 76 is a composite of layers, the number of layers can be five as depicted or can be fewer or greater than five. Similarly the relative thicknesses of alternating layers can differ from the exemplary composite shown.

In particular aspects and for capacitor structures having inter-plate support features (described below) it can be preferable that composite insulator material 76 contain layers of differing composition such that one or more of the layers present in the composite can be selectively removed relative to other layers or materials of the composite 76. In an exemplary composite, alternating layers of material can be provided. For example, layers 66, 70 and 74 can comprise a first material such as, for example, an oxide material such as borophosphosilicate glass (BPSG). Intervening alternating layers 68 and 70 can be, for example, a nitride material such as $Si_3N_4$. The thicknesses and/or relative thicknesses of the layers in the composite are not limited to particular values.

Exemplary thicknesses for insulative layer 76 can be from about 5000 Angstroms to about 30,000 Angstroms. In particular applications it can be preferable to have layer 76 provided to be within an upper range within the exemplary range of thicknesses to allow increased capacitor plate height and increased capacitance (discussed below). An exemplary composite of alternating layers can be formed by depositing a first oxide layer to a thickness of about 5000 angstroms for example, followed by deposition of a first nitride layer to a thickness of about 200 angstroms. A second oxide layer of about 5000 angstroms can be deposited over the first nitride layer, followed by a second nitride layer of about 200 angstroms thick, and a third oxide layer of about 5000 angstroms. Continued deposition of alternate layers can be performed to achieve a desired thickness.

Referring to FIG. 11, a layer of patternable material 78 such as, for example photoresist, is deposited over the upper surface of insulative layer 76 and is patterned to form a plurality of pattern openings 80 by, for example, photolithographic patterning techniques. Mask 78 can be formed to have sub-lithographic features by, for example employing spacer technologies to produce the mask to have anisotropically etched spacers, as will be understood by one skilled in the art. Openings 80 are preferably provided to be double-pitched (having two openings per plug pitch) and vertically aligned and centered relative to each contact plug 64, with alternative openings 80 vertically aligned and centered relative to the horizontal spacing between plugs 64 in a given row. Openings 80 are preferably formed to be trenches which run substantially orthogonally relative to the rows of plugs such that a series of substantially parallel trenches is formed across upper surface of insulative material 76.

Figure 12:
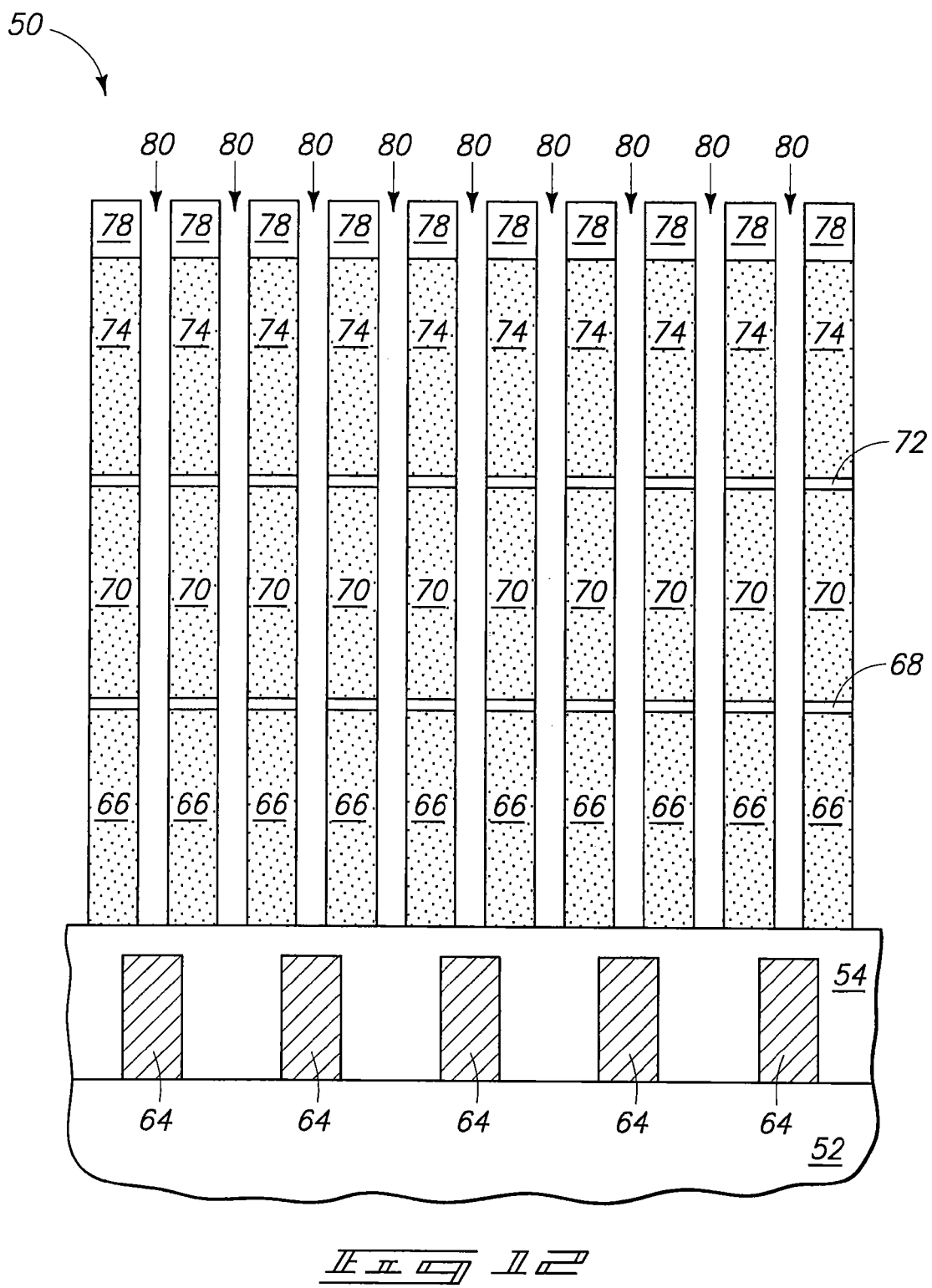
FIG. 12 is a view of the FIG. 3 wafer fragment at a processing stage subsequent to that of FIG. 11.

With reference to FIG. 12, openings/trenches 80 are extended into insulative composite material 76. Extending the openings can utilize, for example, dry etch techniques. The extending can be performed utilizing a single etch chemistry or can utilize multiple etch chemistries. Single etch chemistry can be useful for aspects of the invention where material 76 is a single homogenous layer. Additionally, single etch chemistry etching can be conducted utilizing etch chemistry that is selective to the materials in composite layering. For example, a single etch chemistry can be utilized which might be selective to etch BPSG and silicon nitride at essentially the same rate. Utilizing such single etch chemistry the etch can be allowed to continue until reaching into a lower region of material 76 such as, for example, BPSG layer 66. A second etching chemistry might then be utilized which will continue to etch BPSG but stop upon reaching material 54 (i.e. silicon nitride) to produce a structure such as depicted in FIG. 12.

Figure 13:
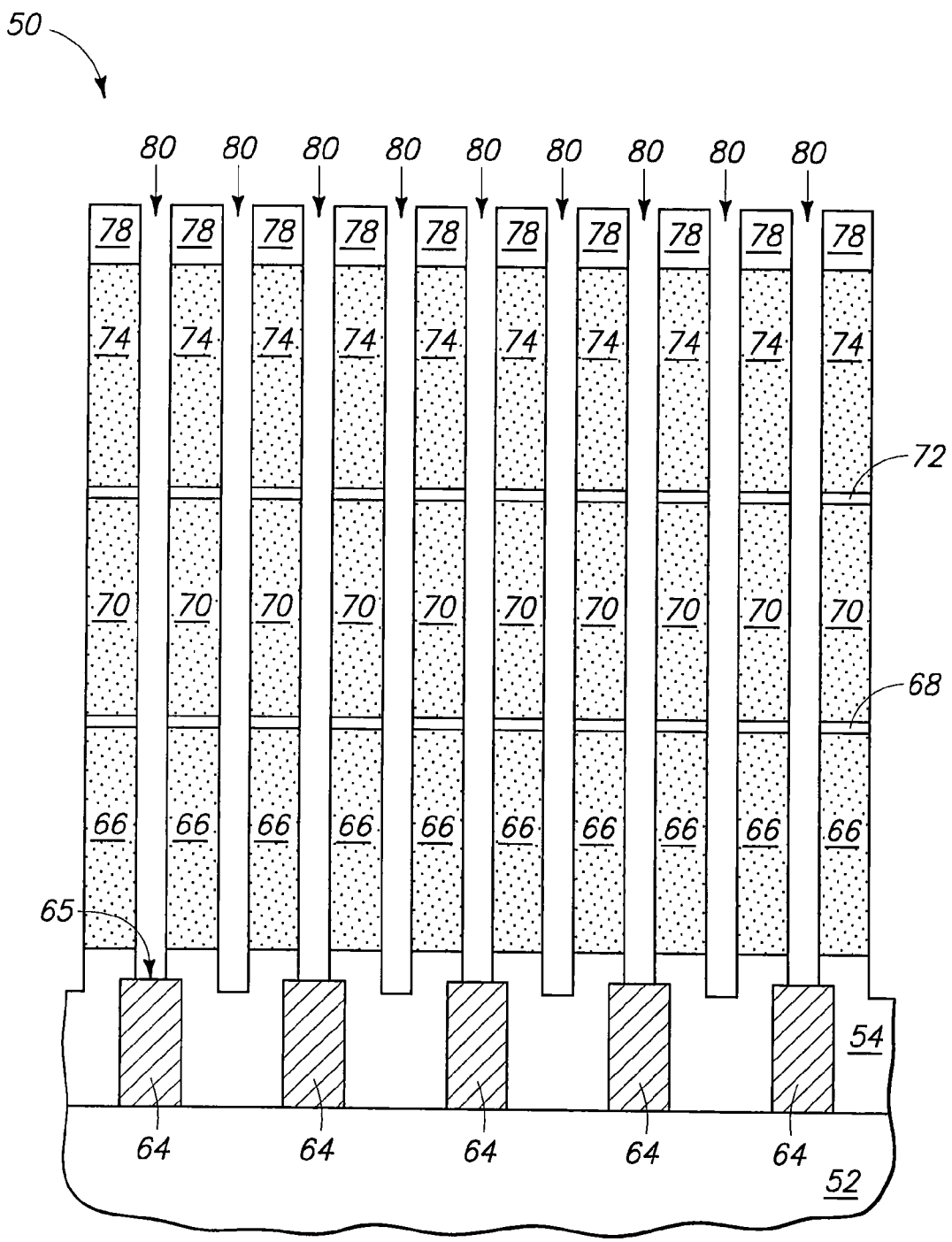
FIG. 13 is a view of the FIG. 3 wafer fragment at a processing stage subsequent to that of FIG. 12.
Figure 14:
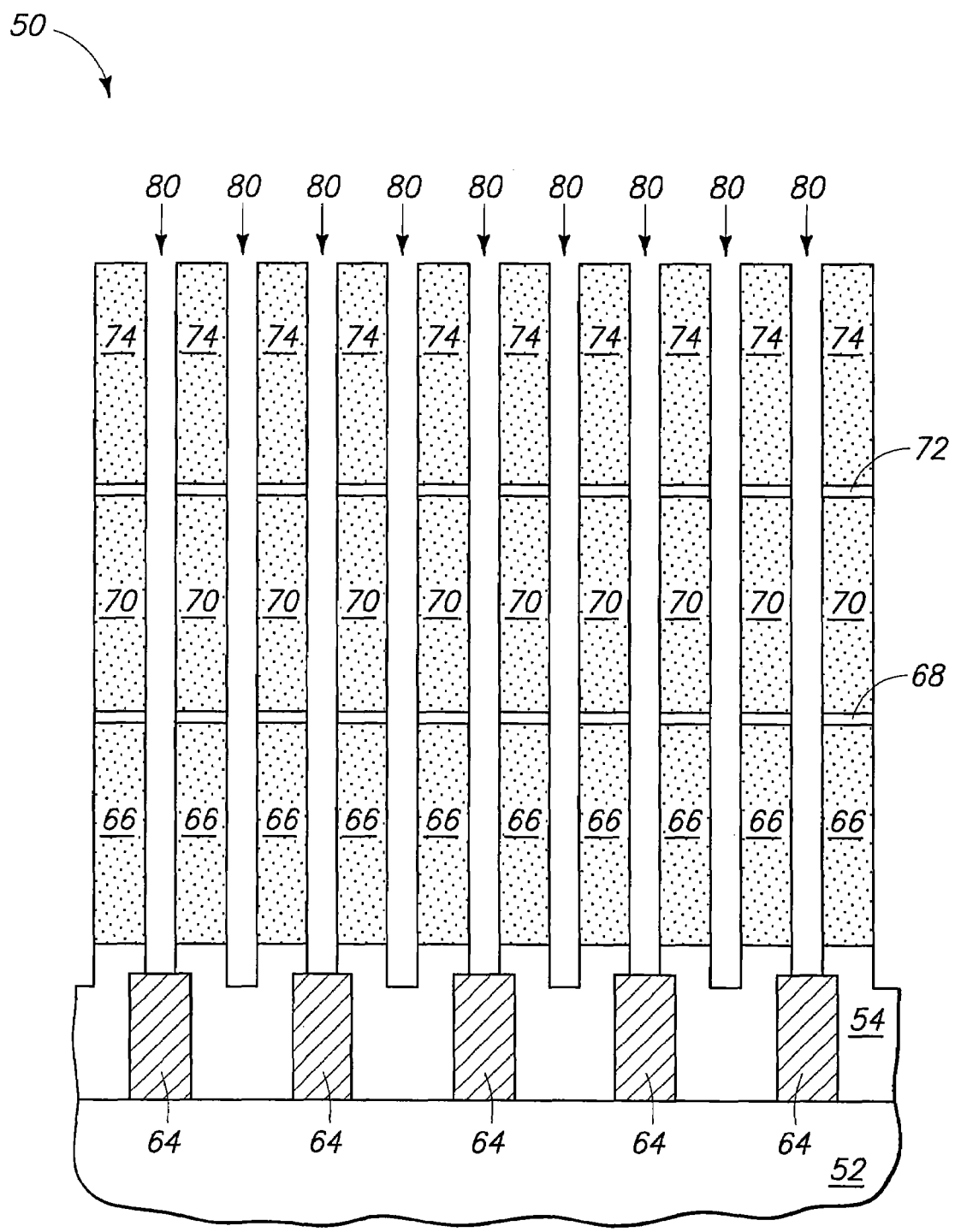
FIG. 14 is a view of the FIG. 3 wafer fragment at a processing stage subsequent to that of FIG. 13.

Referring to FIG. 13, an additional dry etch, for example, such as a timed etch can be conducted to extend the damascene openings to expose upper surfaces 65 of plugs 64. It is noted that some over etch may occur with respect to adjacent trenches disposed in areas between conductive plugs as illustrated. In alternative processing, multiple etch chemistries having differing selectivities can be utilized to independently and sequentially etch individual layers in a composite of layers comprised by material 76. Subsequent to trench formation, mask material 78 is removed as shown in FIG. 14, by for example, resist stripping, resulting in a plurality of substantially parallel trenches 80 separated by a plurality of insulative columns.

Figure 15:
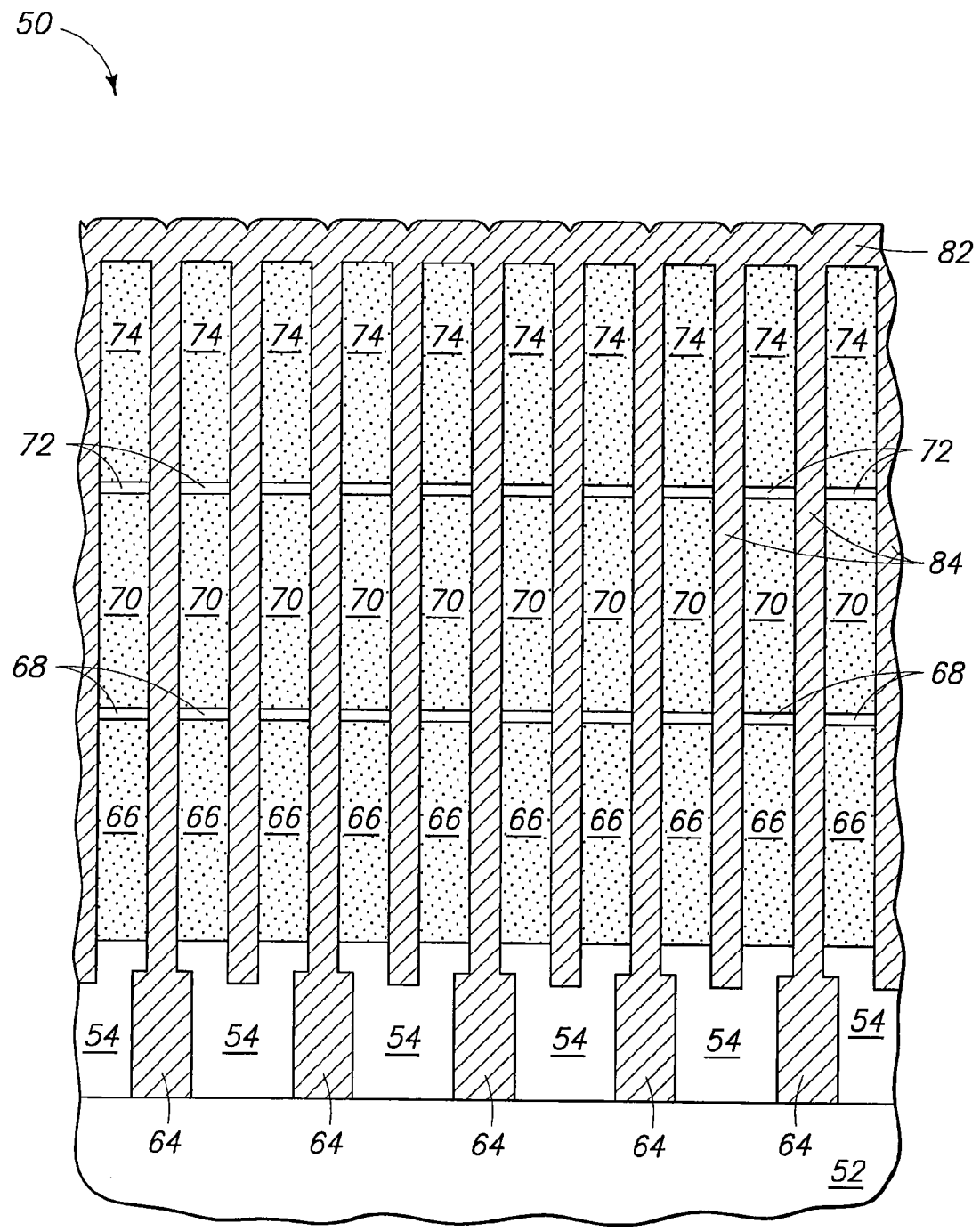
FIG. 15 is a view of the FIG. 3 wafer fragment at a processing stage subsequent to that of FIG. 14.

Referring to FIG. 15, a conductive material 82 is deposited to fill the damascene trenches thereby forming a plurality of conductive layers 84. Conductive material 82 can be, for example, TiN or in preferred aspects can be conductively doped polysilicon or hemispherical grain polysilicon (HSG).

Figure 16:
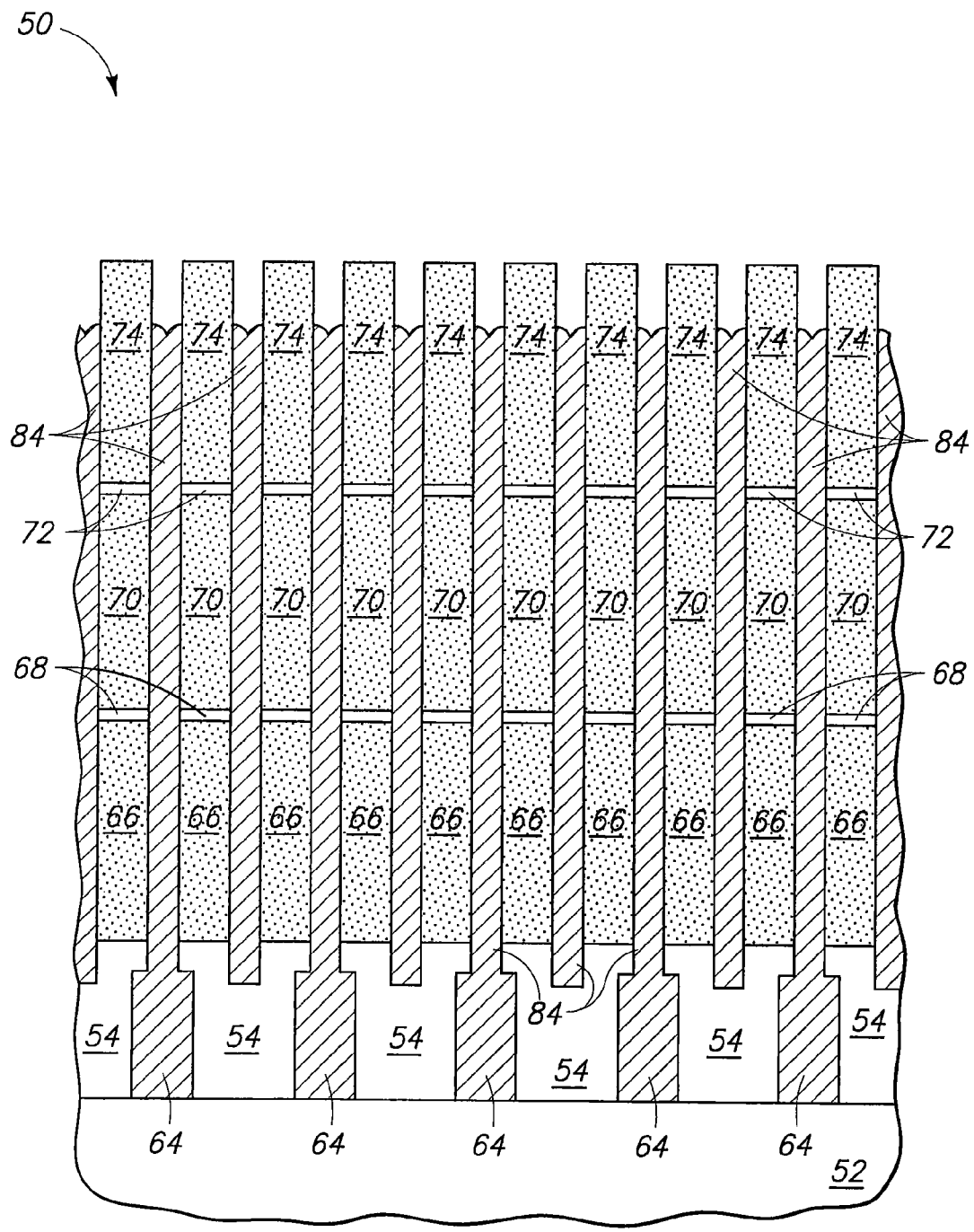
FIG. 16 is a view of the FIG. 3 wafer fragment at a processing stage subsequent to that of FIG. 15.

In order to electrically separate individual conductive layers 84 from one another, material 82 can be removed from over an upper horizontal surface of insulative material 76. Conductive material can be removed by, for example, chemical mechanical polishing (CMP) or dry etch back techniques. With reference to FIG. 16, in particular aspects of the invention removal of overlying conductive material 82 can utilize a dry etch back which can remove conductive material below an upper surface of insulative material 76 such that the conductive layers 84 are recessed relative to the surface openings. Formation of such recess can be advantageous during subsequent processing stages such as in aspects of the invention where a maskless CMP technique will be utilized (discussed below).

Figure 17:
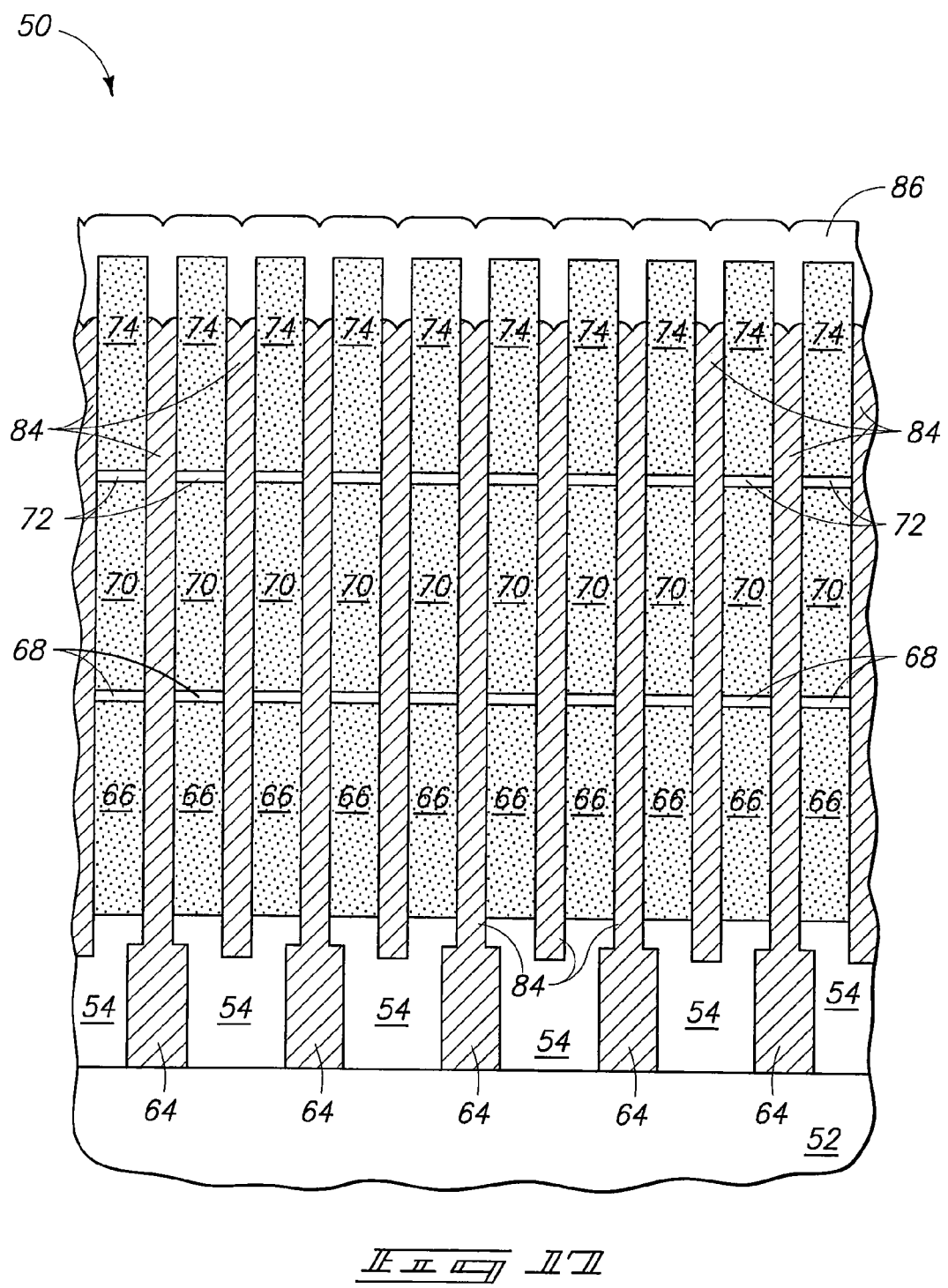
FIG. 17 is a view of the FIG. 3 wafer fragment at a processing stage subsequent to that of FIG. 16.
Figure 18:
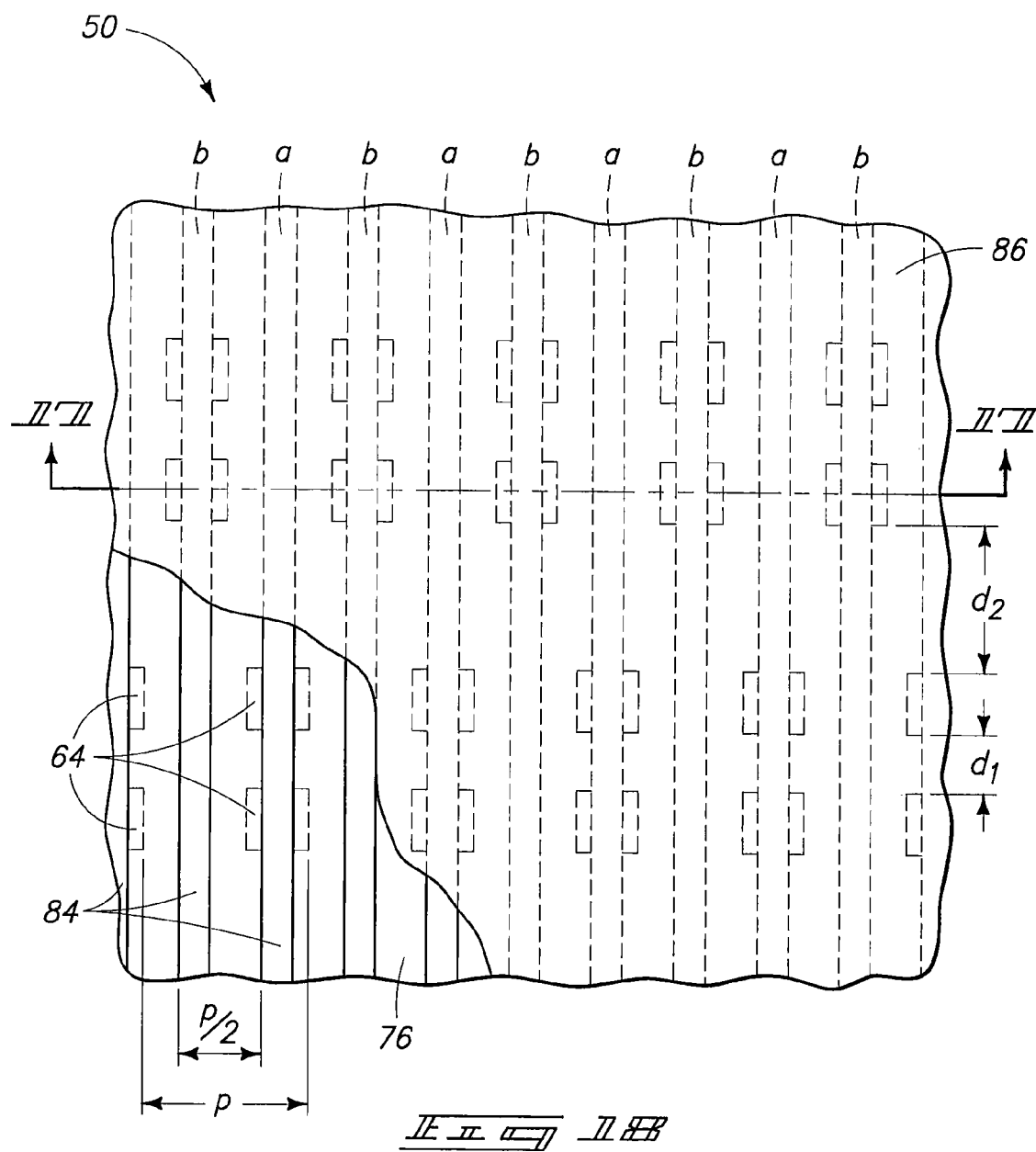
FIG. 18 is a top view of the FIG. 3 wafer fragment at the processing stage shown FIG. 17. The cross-section depicted in FIG. 17 is taken along line 17-17 of FIG. 18.

Referring next to FIG. 17, an insulative upper layer 86 can be formed over insulative material 76 and within the recessed portion of opening 80. Material 86 can preferably be a nitride material and can be referred to as an upper nitride layer. FIG. 18 shows a top view looking down through material 86 and depicting features below the upper nitride as dashed lines. The cross-sectional view depicted in FIG. 17 is taken along line 17-17 of FIG. 18. As illustrated, processing in accordance with the invention as described above can produce a plurality of continuous and substantially parallel conductive layers 84. The overall design pitch or "plug pitch" is designated as P. Conductive lines 84 can preferably be provided such that a "plate pitch" is approximately P/2, or more preferably substantially equivalent to P/2. For purposes of the description, the term "plate pitch" is utilized to refer to the conductive plate or conductive layer design spacing and is defined as the sum of the plate (or layer) width and the distance of the space between adjacent plates (or layers).

As illustrated in FIG. 18, where the plate pitch is half the overall design pitch P, there are two conductive layers per repetitive pattern in the plug array. Such double conductive layer per pattern pitch can be referred to as double-pitch conductive layers. As illustrated, the conductive layers 84 are preferably centrally aligned relative to the upper surfaces of contact plugs 64. Alternating conductive lines are designated 'a' with interposed alternating lines being designated 'b'. Lines 'a' are preferably formed to pass centrally across upper surfaces of plugs 64 in rows C and D, and centrally between adjacent plugs present in rows A and B. Interposed alternating conductive layers 'b' conversely pass centrally across upper surfaces of contact plugs 64 in plug rows A and B while passing centrally between adjacent plugs present in rows C and D.

Figure 19:
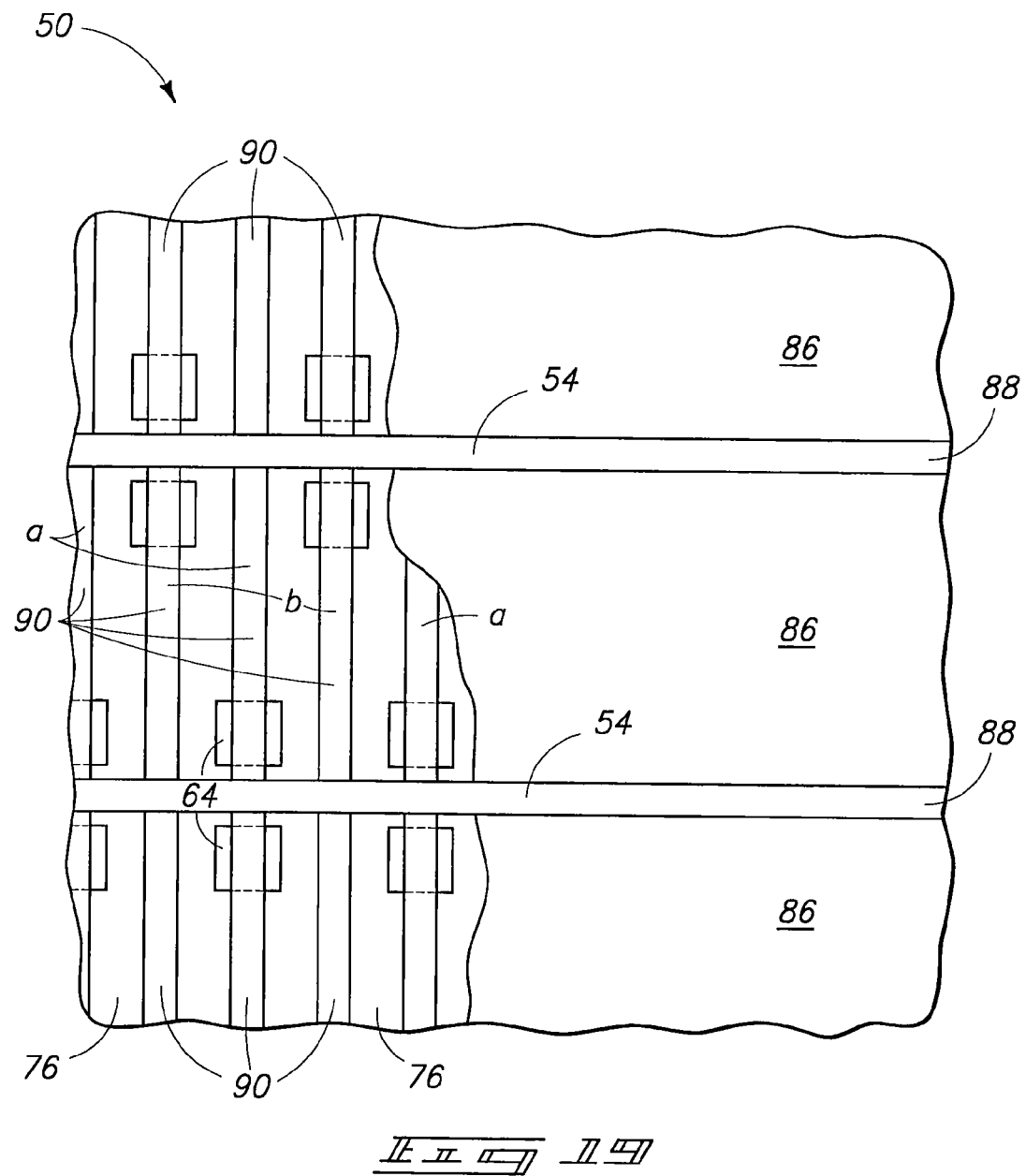
FIG. 19 is a top view of the FIG. 3 wafer fragment at a processing stage subsequent to that of FIG. 18.

Referring to FIG. 19, additional processing is conducted to form a plurality of trenches 88 through upper nitride material 86 and through conductive material 82 and insulative material 76, to thereby expose material 54 at the base of such trenches. Formation of trenches 88 can be achieved by, for example, forming an etch mask over nitride material 86 and anisotropically etching through the nitride material 86, conductive material 82 and insulative material 76.

As shown by the left hand portion of FIG. 19 where material 86 is shown cut away for ease of description and clarity, trench 88 is formed such that the trench transects each of the conductive layers substantially orthogonally relative to the long axis of the conductive layers. Formation of trenches 88 thereby separates each of the conductive layers forming multiple rows of parallel individual conductive plates 90. Individual plates 90 are each in electrical contact with a single contact plug 64 and can thereby function as storage plates or bottom capacitor plates in individual memory cells.

The process of separating to form individual plates 90 produces individual rows of substantially parallel bottom plates with each of the bottom plates spanning the distance $d_2$ between adjacent offset rows as illustrated in FIG. 19. For example, alternating bottom plates 'b' in the central row of plates depicted are each in electrical contact with a contact plug in second row B and each spans the distance $d_2$ between rows B and C. As further illustrated, each of bottom plates 'b' is interposed between two adjacent alternating plates 'a' each of which is associated with a single contact plug 64 within the third row of plugs C.

Although not limited to specific dimensions, each of capacitor plates 90 can preferably have substantially equivalent dimensions relative to on another. In an exemplary array, plates 90 can have a plate length that is as much as ten times the plate width or more. In particular applications, plates 90 can have a plate width of about 0.5 F and a plate length of from about 5 F to about 5.

Figure 20:
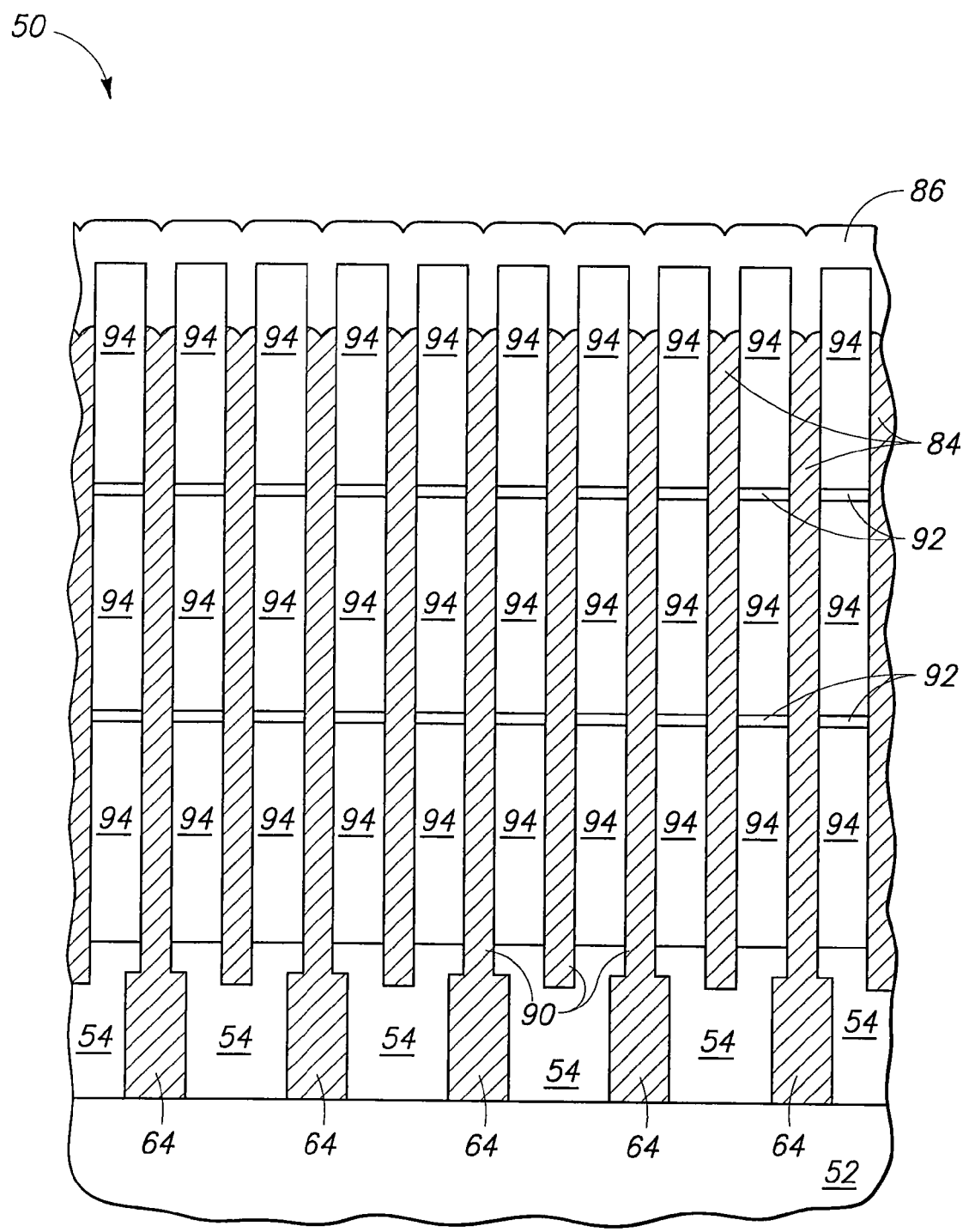
FIG. 20 is a cross-sectional view of the FIG. 3 wafer fragment shown at a processing stage subsequent to that of FIG. 19.

Referring next to FIG. 20, such illustrates a row having a plurality of vertical storage plates 90 with alternating plates being in electrical contact with a contact plug 64 within a given row. Upon formation of individual plates, wafer fragment 50 can undergo further processing by, for example, removal of all or a portion of insulative material 76. Where insulative material 76 comprises a composite of layers, removal of material can comprise removing particular layers while retaining other layers present in the composite. For example, and as depicted in FIG. 20, BPSG layers 66, 70, 74 can be removed or substantially removed from between conductive plates 90 while retaining nitride portions between the conductive plates.

The presence of trench 88 (shown in FIG. 19) can allow side access to a wet isotropic etch for removal of all or substantially all of the oxide material layers of insulative material 76 to produce openings 94 between conductive plates 90. Such wet isotropic etch is selective to silicon nitride such that silicon nitride support structures 92 are retained between bottom plates 90. Support structures 92 can advantageously provide support for capacitor plates during subsequent processing. Additional support is provided during subsequent processing by the presence of upper nitride layer 86. It is to be additionally noted that upper nitride layer can also be present in peripheral surfaces (not shown) and can protect the periphery during subsequent processing.

Figure 21:
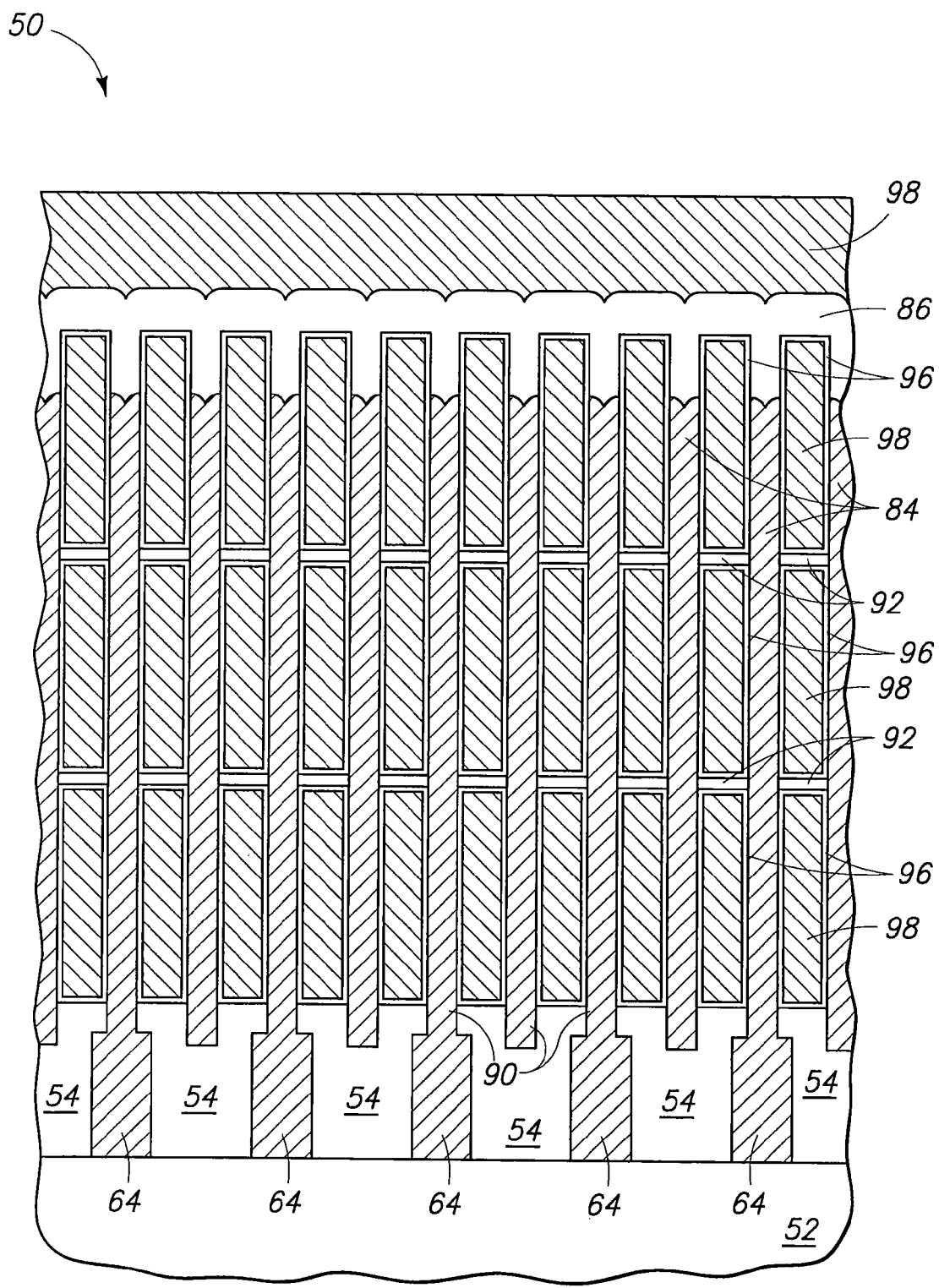
FIG. 21 is a view of the FIG. 3 wafer fragment at a processing stage subsequent to that of FIG. 20.

With reference to FIG. 21, a layer of dielectric material 96 is formed over individual first capacitor plate structures 90. Where plate structure 90 comprise polysilicon, appropriate anneal processing can be performed to convert at least some of the polysilicon to hemispherical grain polysilicon (HSG) prior to formation of the capacitor dielectric layer. After depositing of an appropriate dielectric material, a cell plate material 98 is deposited between individual plates 90 and over the upper surface of wafer fragment 50. Cell plate material 98 can preferably be, for example, conductively doped polysilicon.

Figure 22:
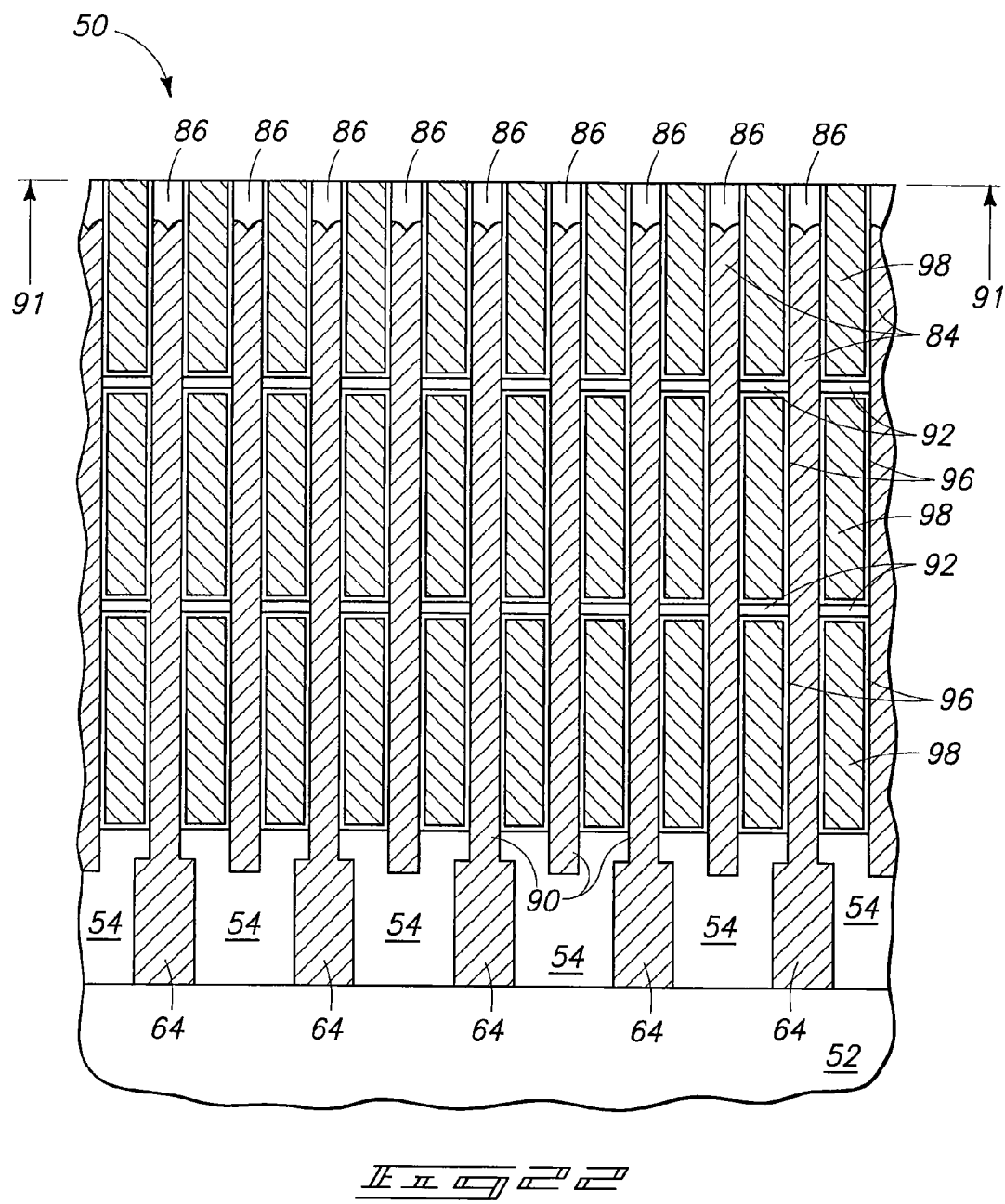
FIG. 22 is a view of the FIG. 3 wafer fragment at a processing stage subsequent to that of FIG. 21.

Referring to FIG. 22, chemical mechanical polishing or a masked etch can be utilized to remove cell plate conductor material 98 in the periphery (not shown) and can also remove an upper portion of cell plate material 98 within the array. Preferably the CMP or etch is performed such that the cell plate material is removed to a horizontal elevation 99, while retaining a portion of upper nitride material 86 disposed over individual bottom plates 90 to avoid damaging or destroying the circuitry. The resulting structure shown in FIG. 22 allows cell plate material 98 to function as second capacitor plates. The second capacitor plates (cell plates) are operably associated with individual first capacitor plates 90 together which function as storage capacitors in individual memory cells in accordance with a preferred embodiment of the invention.

Figure 23:
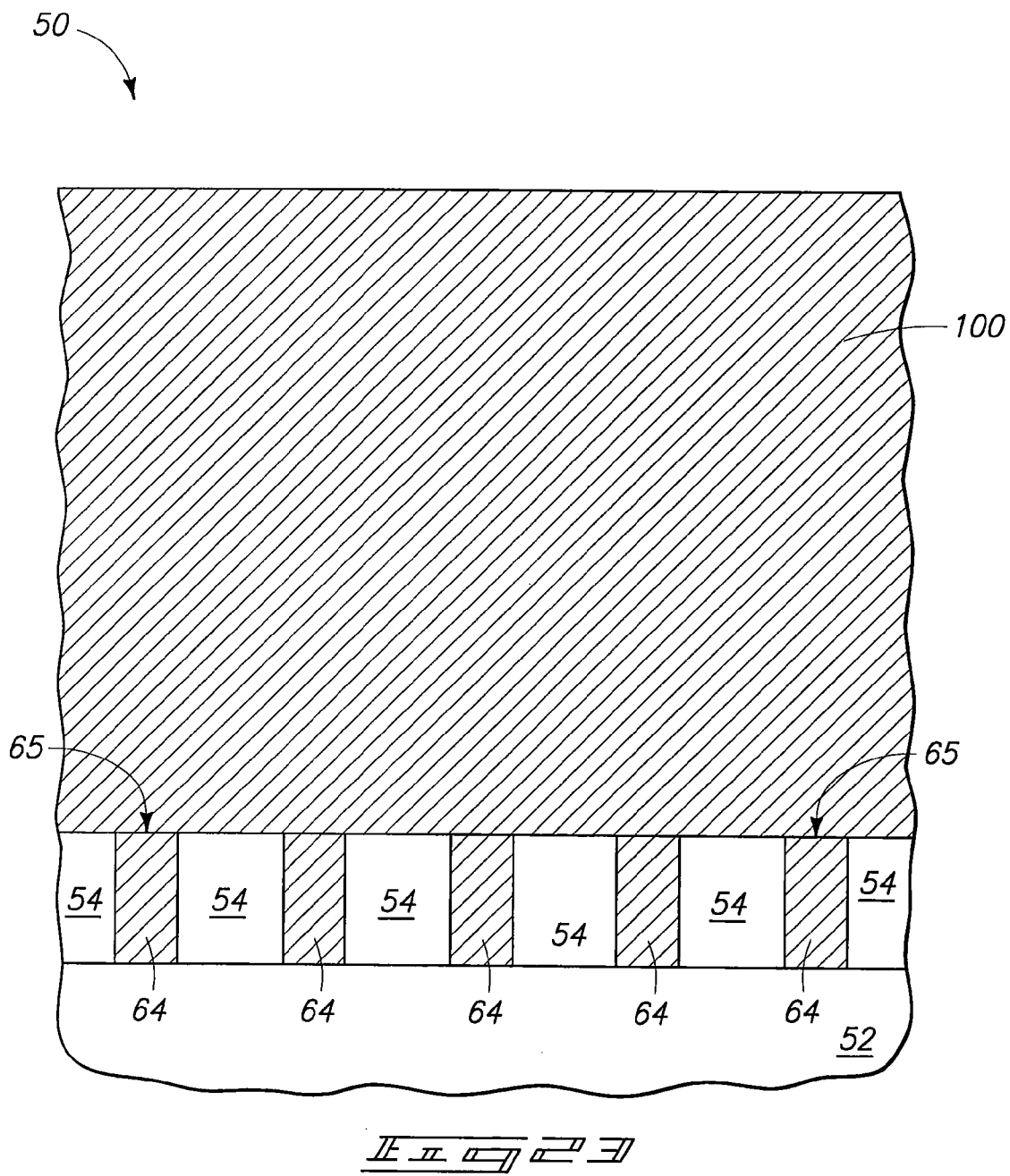
FIG. 23 is a view of the FIG. 3 wafer fragment at an alternative processing stage subsequent to that of FIG. 7.
Figure 24:
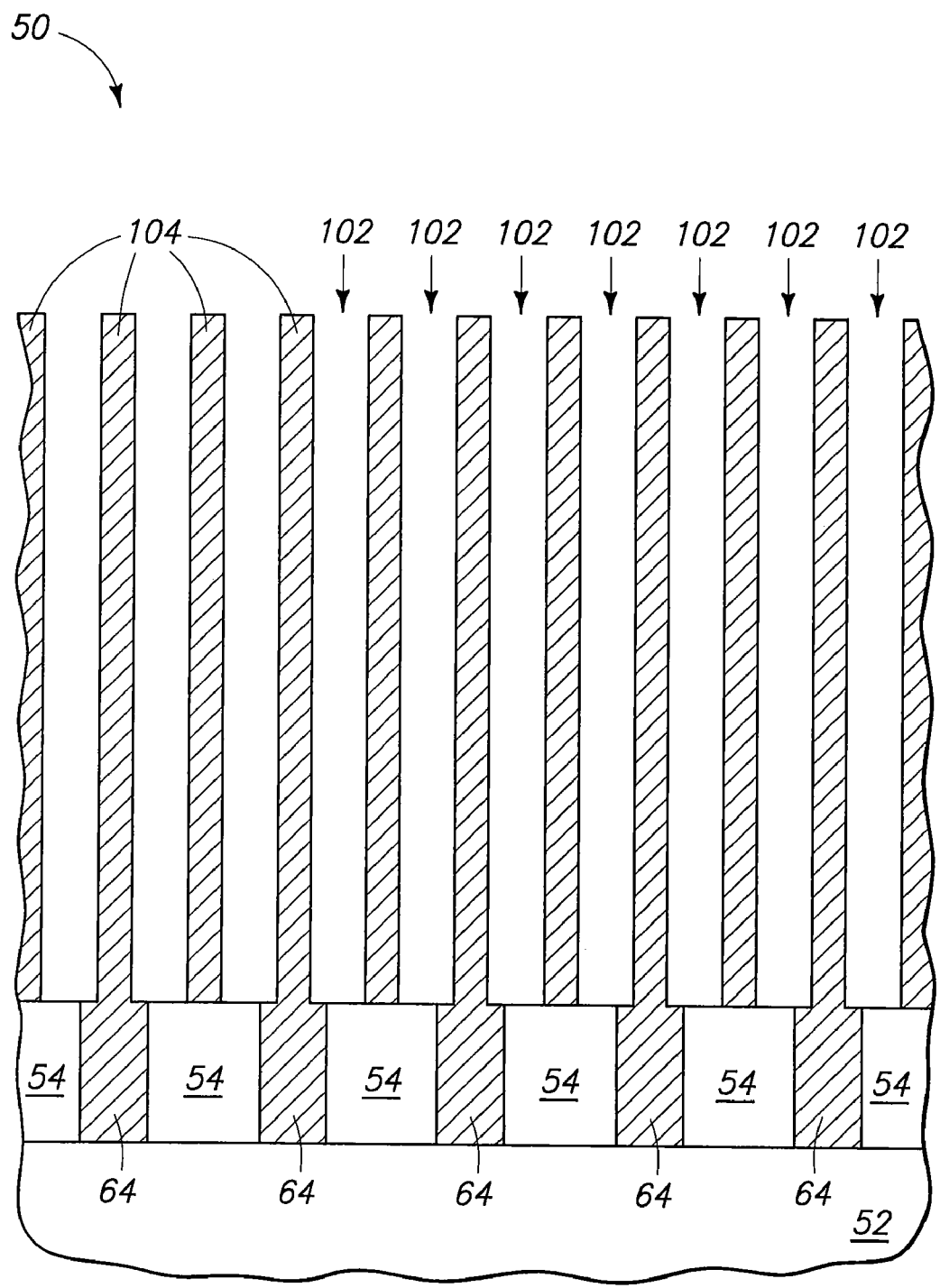
FIG. 24 is a view of the FIG. 3 wafer fragment at a processing stage subsequent to that of FIG. 23.

Alternative methodology and processing to produce double-pitched capacitor structures in accordance with the invention is described as follows. Referring to FIG. 23 such shows alternative methodology continuing from a processing stage depicted in FIGS. 7 and 8. In this alternative processing, a conductive material 100 is deposited over the array of plugs 64 such that the conductive material electrically contacts upper surfaces 65 of the contact plugs. Conductive material 100 is then subjected to subtractive etching to form individual conductive layers 104 separated by openings 102 which extend to the upper surface of insulative layer 54. Accordingly, individual conductive layers 104 are electrically separated from one another. The subtractive etch to produce the plurality of conductive layers preferably utilizes masking and patterning techniques to produce double-pitched conductive layer patterning as described above. Referring to FIG. 25, the resulting pattern of layers preferably comprises a plurality of substantially parallel conductive layers 104 having spacing and patterning as described relative to the conductive layers in the previous embodiment. However, the structure depicted in FIG. 25 differs from that produced by the earlier processing in that insulative material 54 is exposed between conductive layers upon initial formation of such conductive layers.

Referring to FIG. 26, additional processing is performed to produce trenches 106 between first row A and second row B and between third row C and fourth row D, leaving rows of individual capacitor plates 108 spanning distance $d_2$ across gap H between second row B and third row C. Formation of trenches 106 can utilize appropriate etching technologies and may comprise depositing an appropriate material between conductive layers 104, forming a patterned mask using photolithography techniques, and transferring the pattern into underlying materials.

Figure 28:
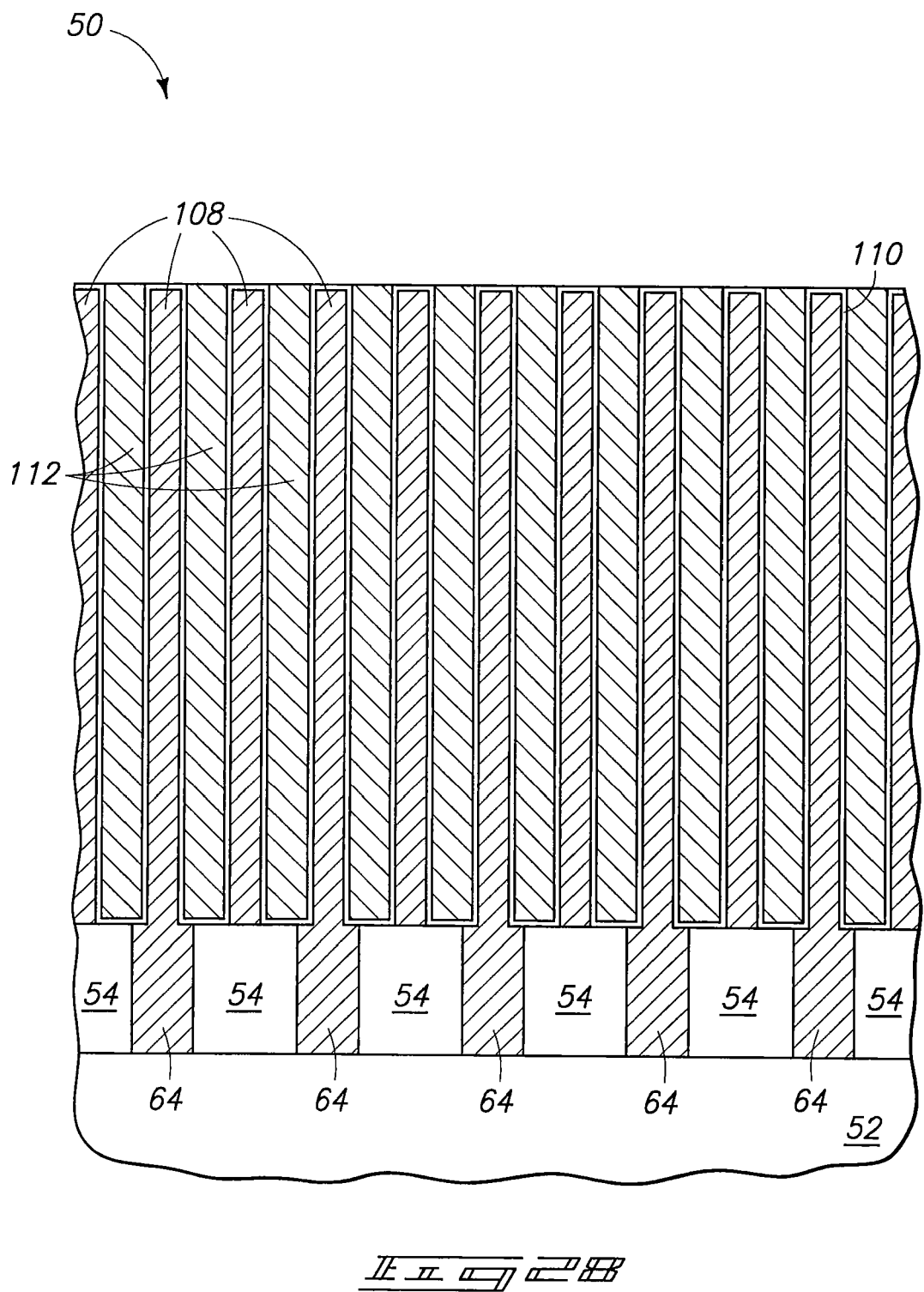
FIG. 28 is a view of the FIG. 3 wafer fragment at a processing stage subsequent to that of FIG. 27.

After separation of the conductive layers into individual storage node plates 108, a layer of dielectric material 110 is deposited over the individual plates and over the substrate. Subsequently, a cell plate material 112 is deposited over wafer fragment 50 substantially filling the openings between adjacent storage node plates 108. The depositing cell plate material 112 can typically comprise forming such material to cover the substrate such that a thickness of such material is present above and over dielectric material 110. Accordingly, after depositing the cell plate material, a masking and patterning processing can be conducted to remove cell plate material from peripheral areas (not shown) and to form independent cell plates as depicted in FIG. 28.

Figure 29:
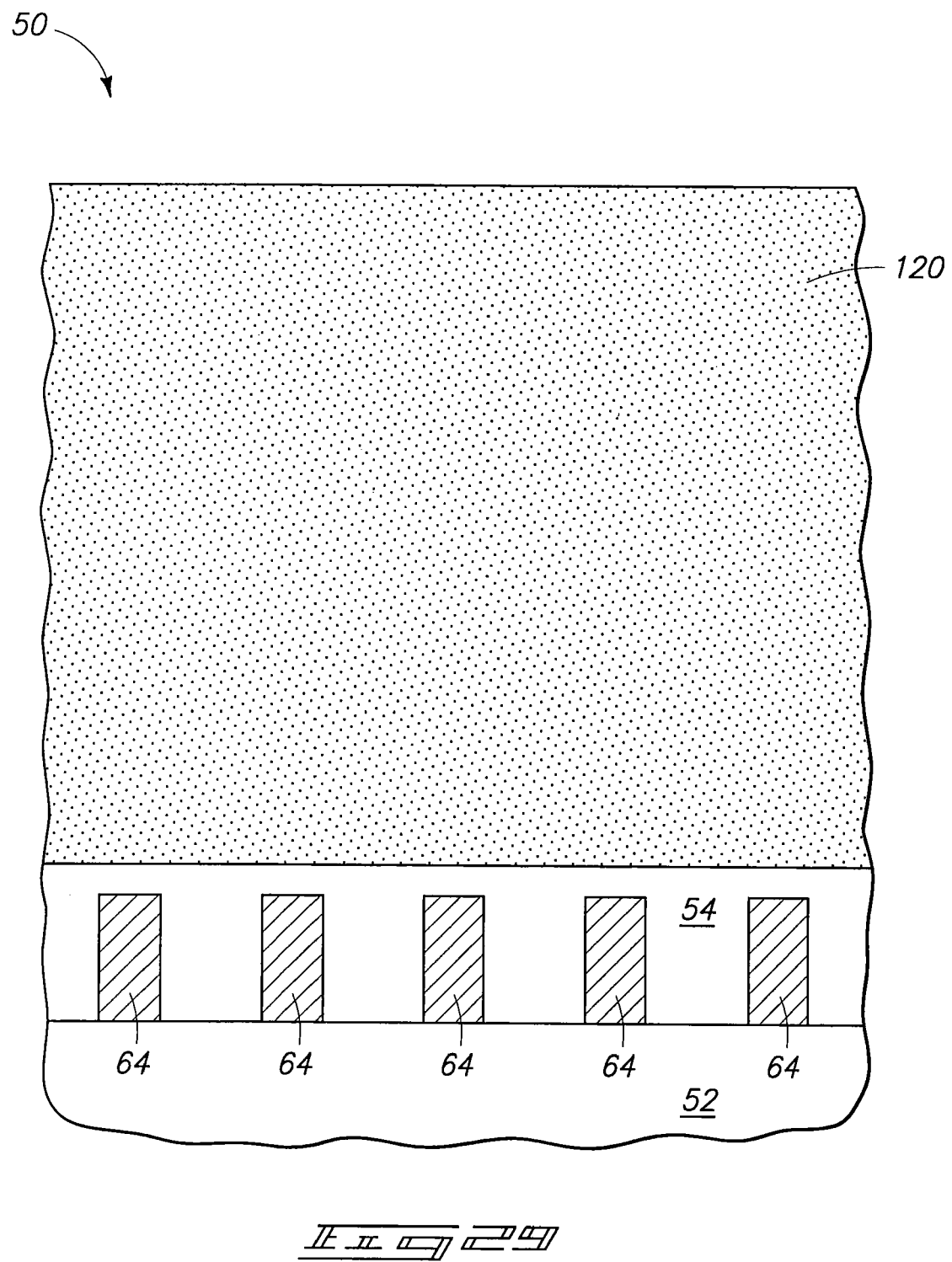
FIG. 29 is a view of the FIG. 3 wafer fragment at an alternative processing stage subsequent to that of FIG. 9.
Figure 30:
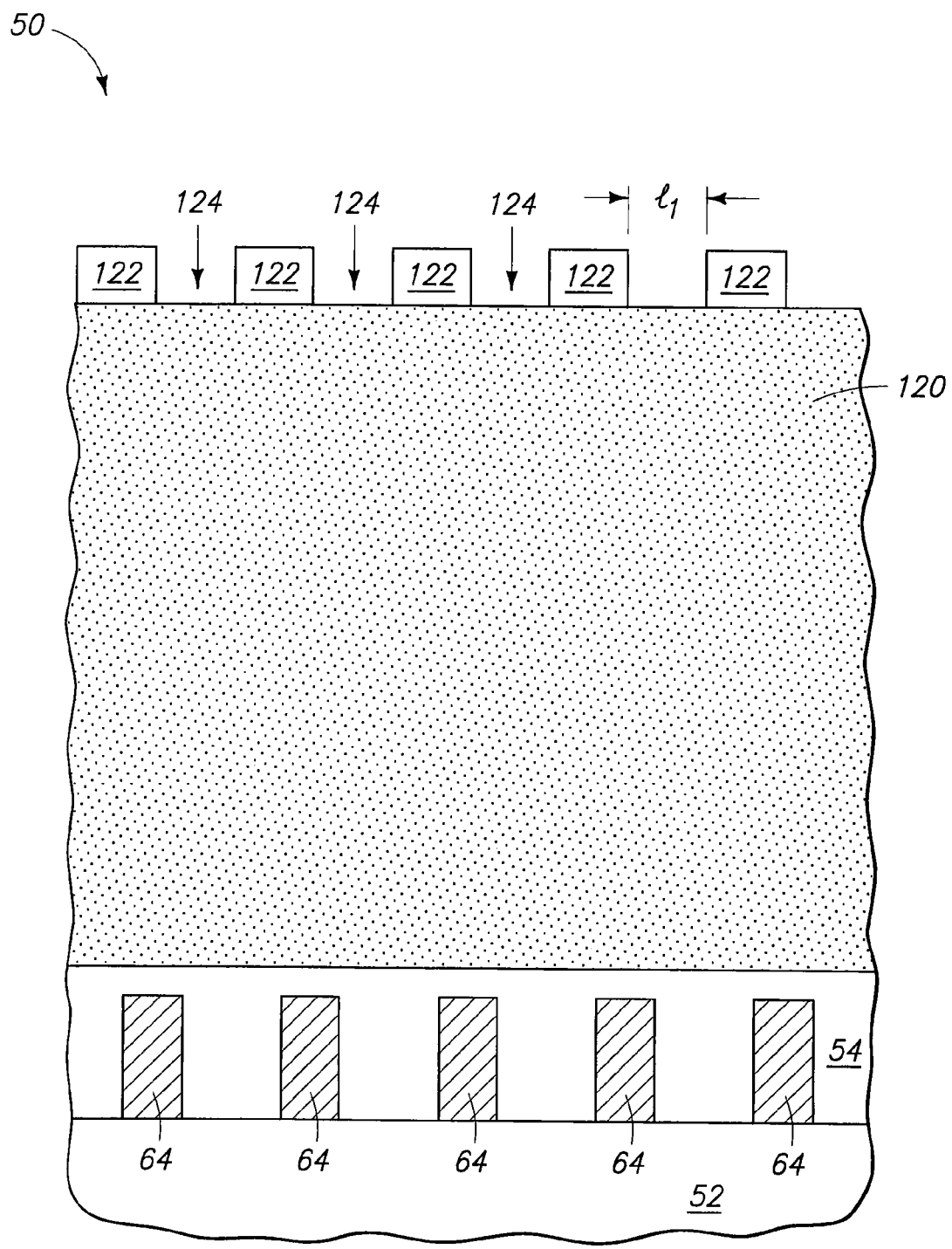
FIG. 30 is a view of the FIG. 3 wafer fragment at a processing stage subsequent to that of FIG. 29.

An additional alternative processing to produce double-pitch plate capacitors is described with reference to FIGS. 29-38. Referring to FIG. 29 such shows continued processing of a wafer fragment 50 relative to that shown in FIG. 9. The further processing of the structure shown in FIG. 9 includes formation of a second insulative layer 120 over insulative layer 54. Material 120 can be, for example, an oxide material such as BPSG, or any other appropriate insulative material. A mask material 122 is provided over insulative layer 120 and is patterned to form a "single pitch" mask pattern having openings 124 such that the mask pattern repeating unit pitch is essentially identical to the plug pattern pitch (described above). Openings 124 in the patterned mask have an opening length designated $l_1$.

Figure 31:
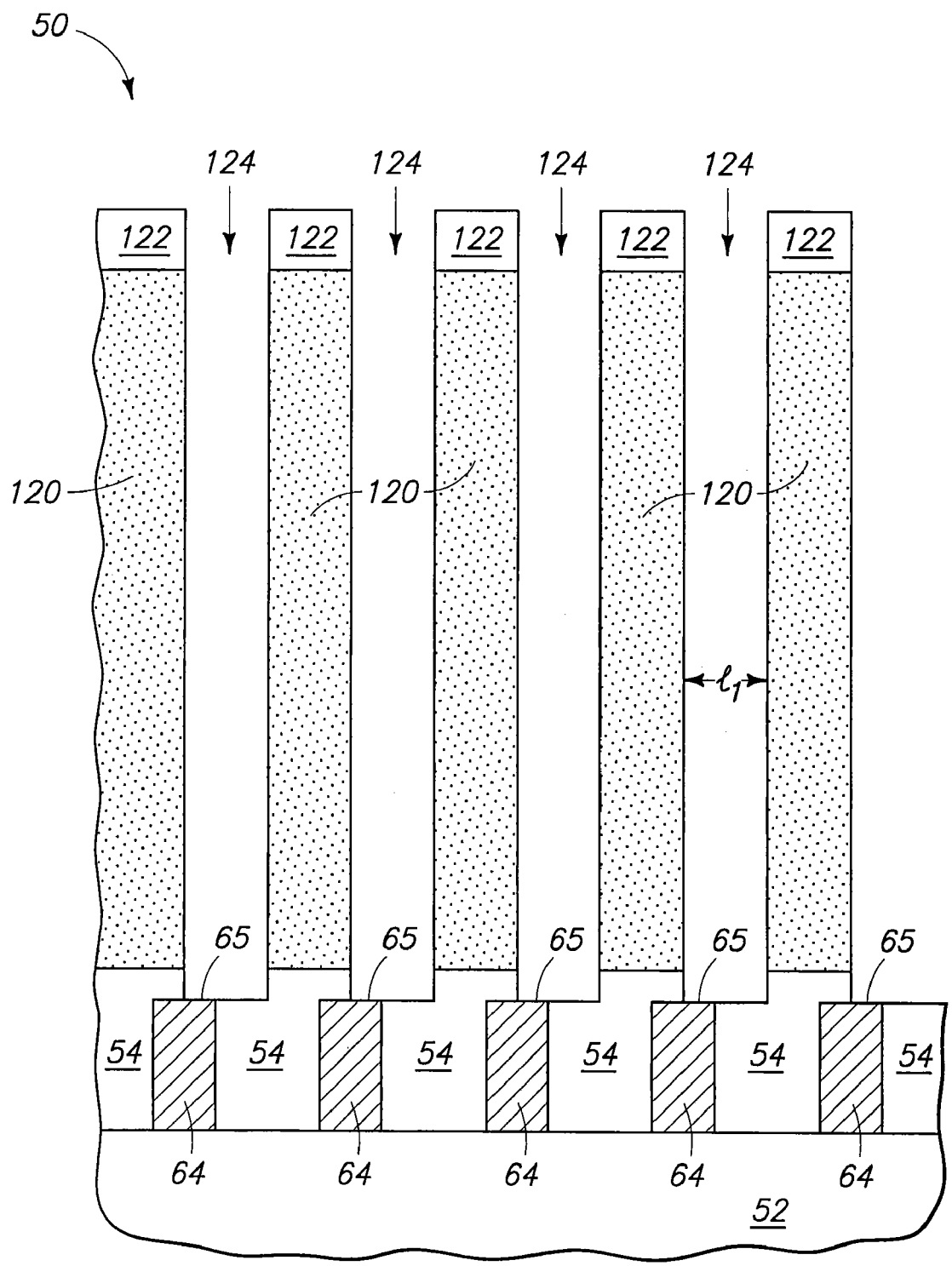
FIG. 31 is a view of the FIG. 3 wafer fragment at a processing stage subsequent to that of FIG. 30.
Figure 32:
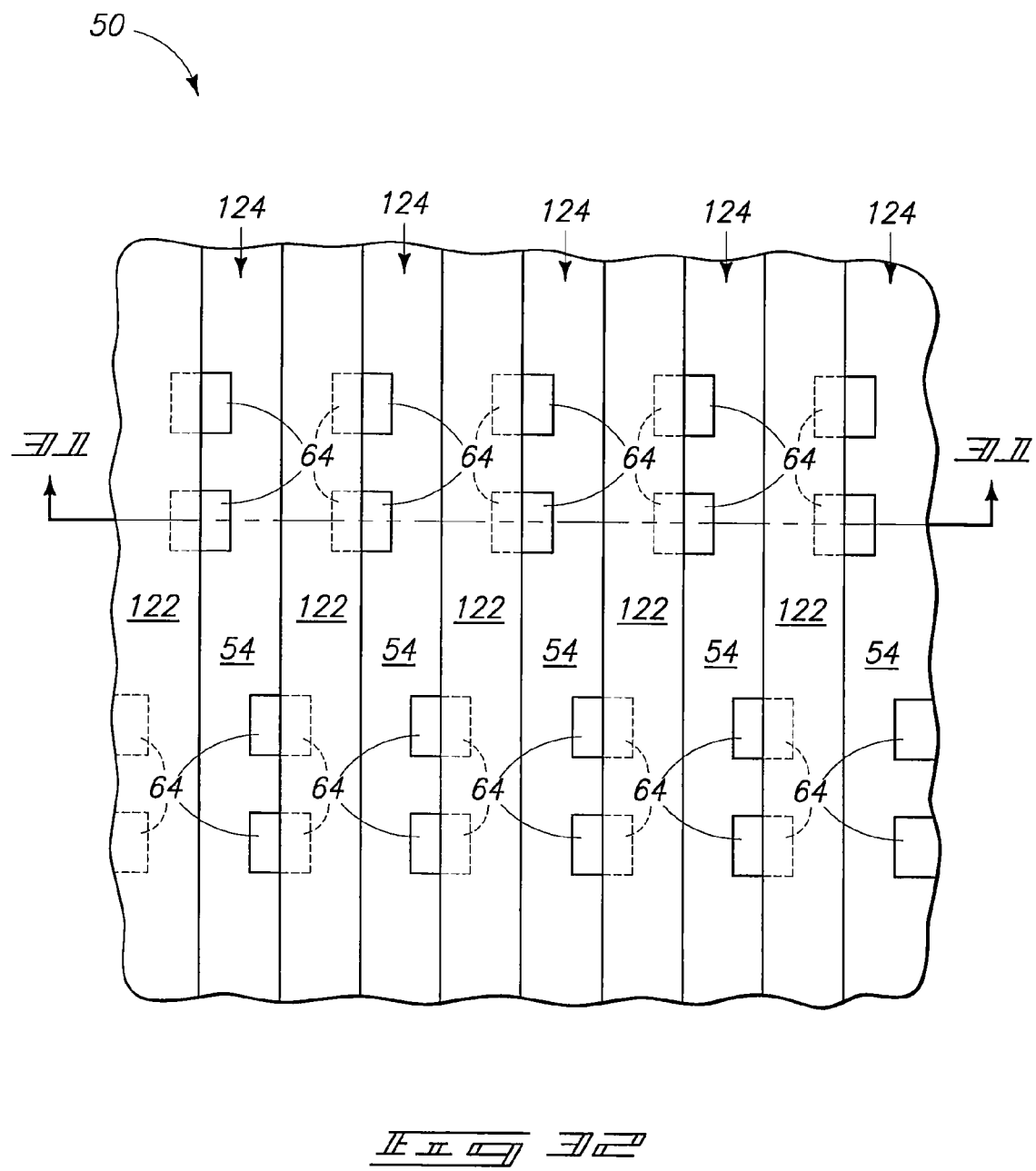
FIG. 32 is a top view of the FIG. 31 wafer fragment, with FIG. 31 being taken along line 31-31.

Referring to FIG. 31, openings 124 are extended into material 120 to form trenches having initial trench width $l_1$. Preferably, trenches 124 extend into material 54 thereby exposing surface 65 of contact plug 64 over a portion of each plug. The extending the openings to form trenches 124 can utilize etching techniques such as, for example, dry anisotropic etching. After formation of the plurality of trenches mask material 122 can be removed from over the resulting columns of insulative material 120 by, for example, resist stripping. Referring to FIG. 32, the resulting top view of the structure depicted in FIG. 31 is shown (where FIG. 31 is a cross-section take along line 31-31 of FIG. 32). Patterning and trench formation can preferably produce single-pitch openings which expose half of the upper surface 65 of each of the capacitor plugs 64 as illustrated.

Figure 33:
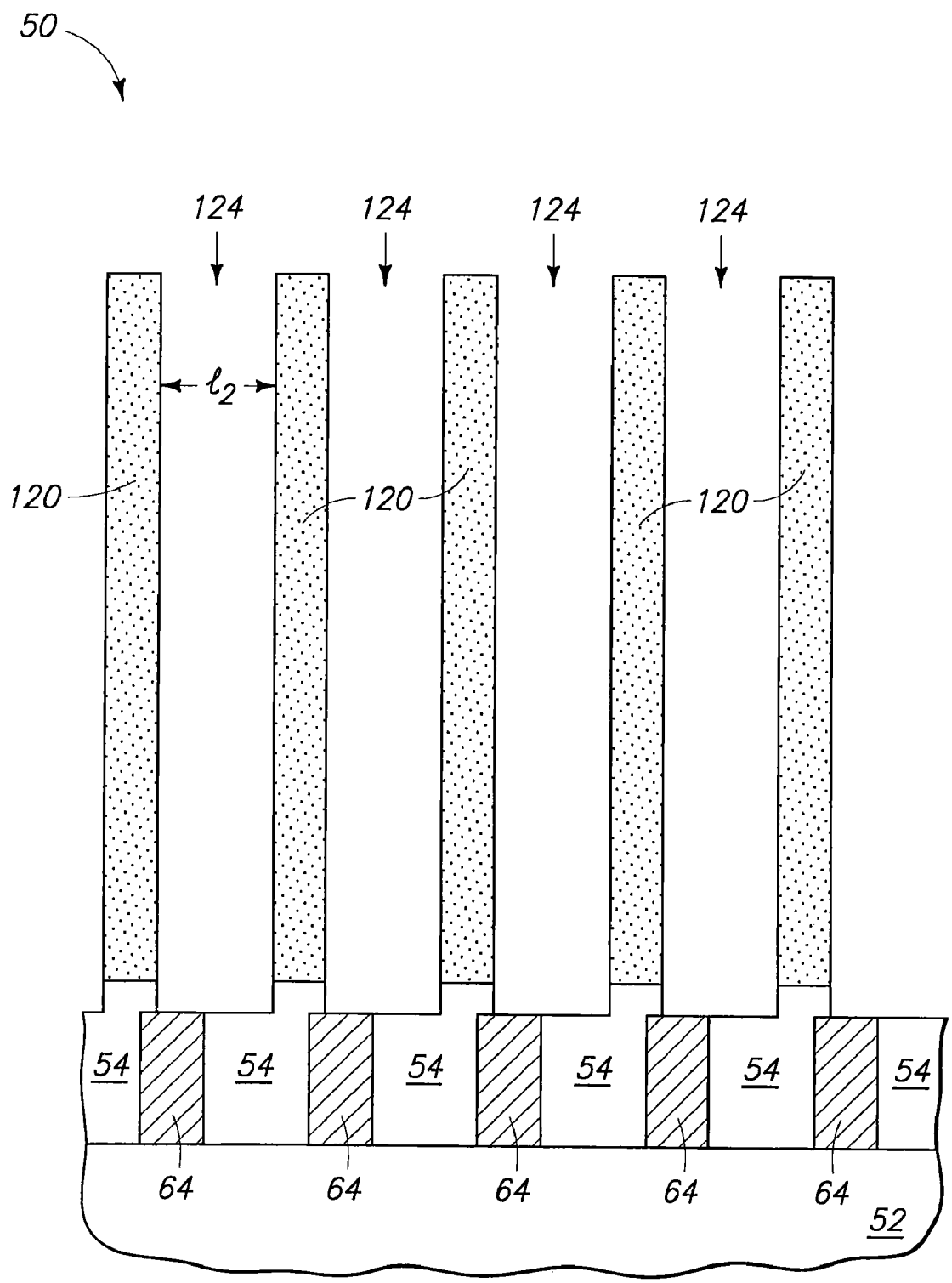
FIG. 33 is a cross-sectional side view of the FIG. 3 wafer fragment at a processing stage subsequent to that of FIG. 31.
Figure 34:
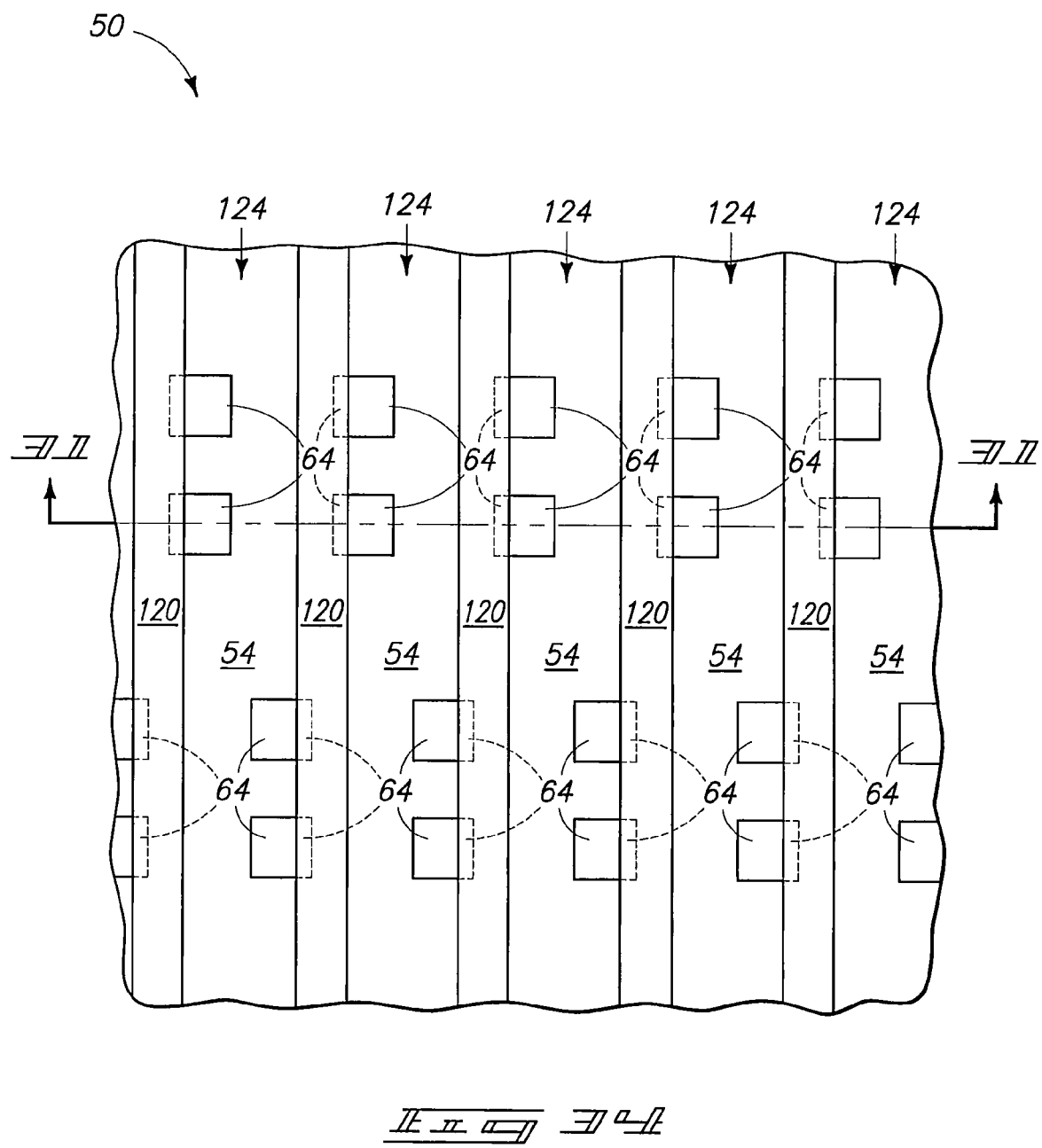
FIG. 34 is a top view of the FIG. 33 wafer fragment with FIG. 33 being taken along line 33-33.

Openings 124 initially having an opening width $l_1$ are subsequently widened to form openings having an opening width $l_2$ as illustrated in FIG. 33. A top view of the structure depicted in FIG. 33 is shown in FIG. 34. As indicated in FIG. 34, an additional portion of each of upper surface 65 is preferably exposed by widening of openings 124. The widening of the openings can be achieved utilizing appropriate etch techniques such as, for example, isotropic wet etch or dry etching techniques.

Figure 35:
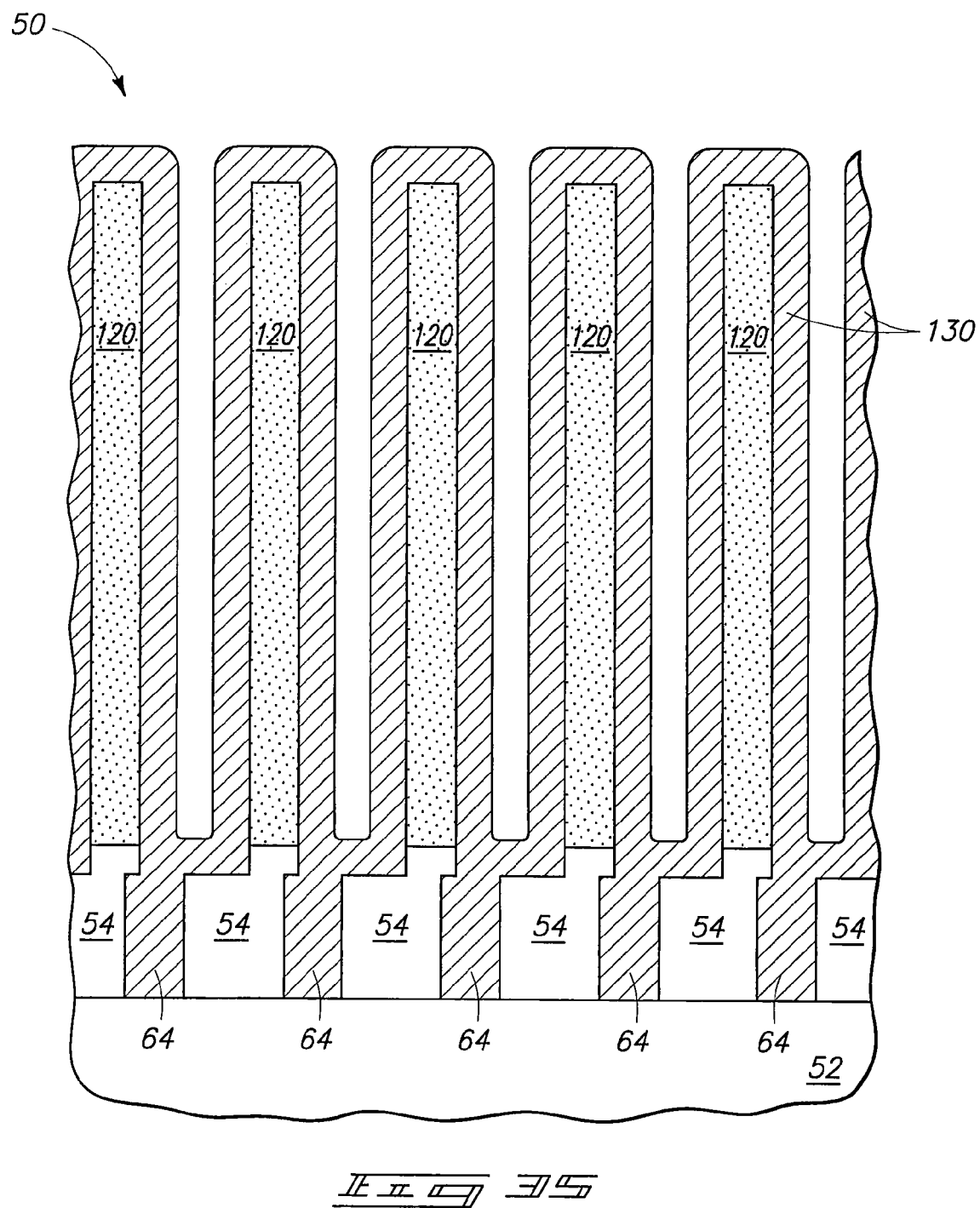
FIG. 35 is a cross-sectional side view of the FIG. 3 wafer fragment at a processing stage subsequent to that of FIG. 33.
Figure 36:
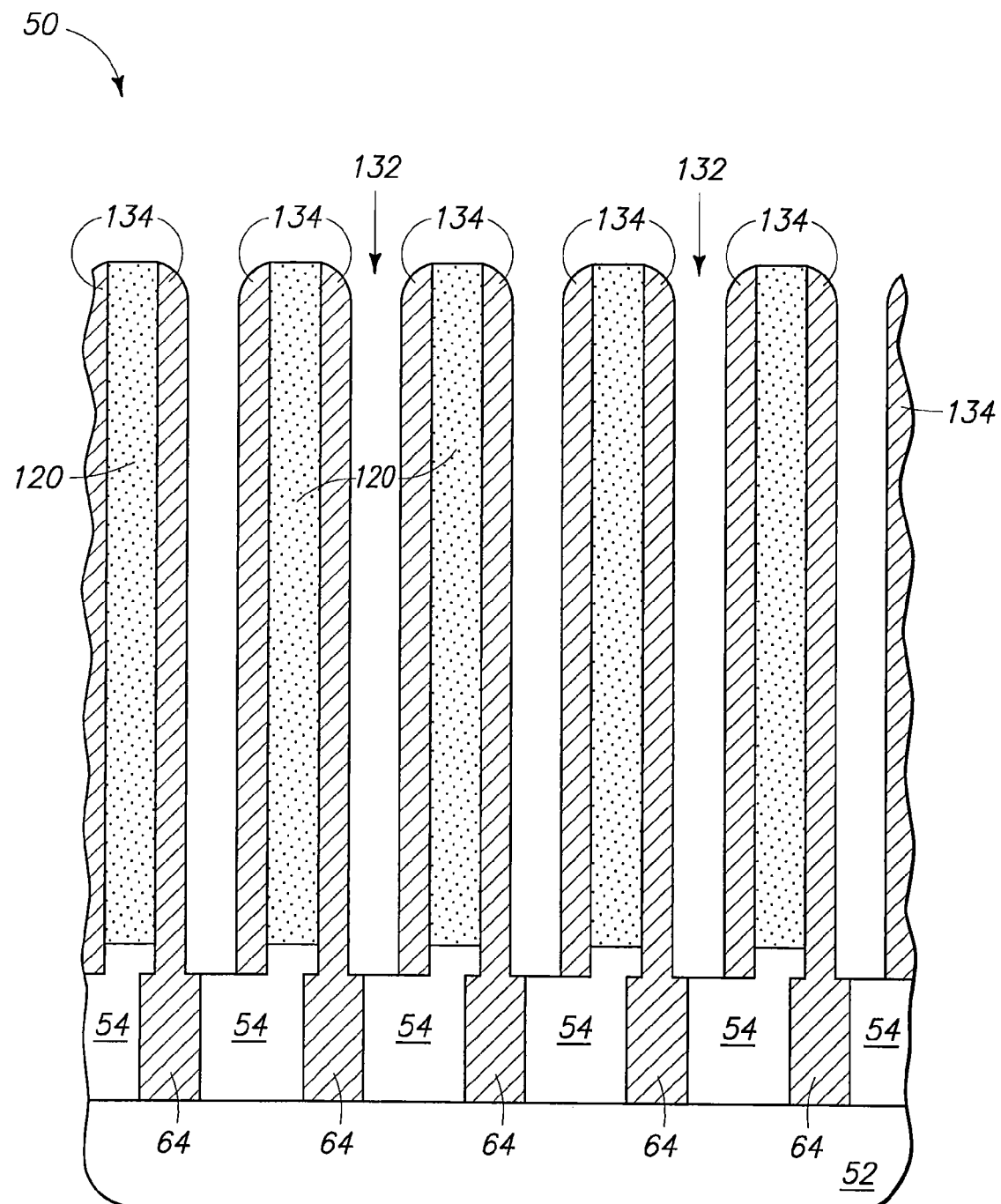
FIG. 36 is a view of the FIG. 3 wafer fragment at a processing stage subsequent to that of FIG. 35.
Figure 37:
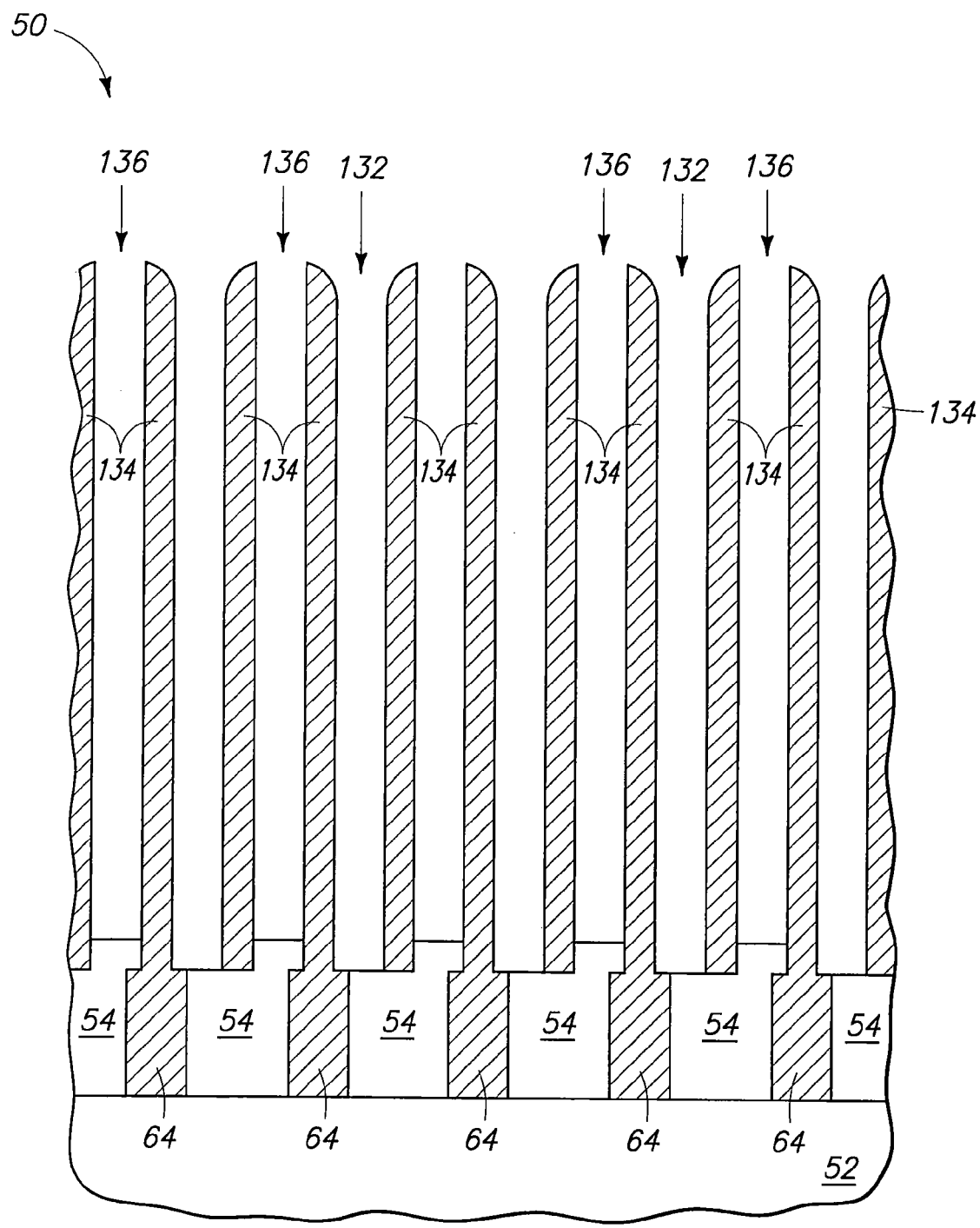
FIG. 37 is a view of the FIG. 3 wafer fragment at a processing stage subsequent to that of FIG. 36.

Referring next to FIG. 35, a conductive material 130 is deposited over substrate 52 to at least partially fill widened openings 124. The conductive material 130 is subsequently anisotropically etched to form narrow trenches 132 between separate conductive layers 134 as depicted in FIG. 36. The anisotropic etching to form separate spacer-like conductive layers is preferably conducted to extend openings 132 to expose material 54 at the base of such openings. Further processing is then performed to produce separate individual storage node plates as depicted in FIG. 37. The additional processing can include, for example, filling of spaces between conductive layers with, for example, an oxide material, forming a patterned mask over the substrate and etching a trench crossing the alternating insulative and conductive layers to separate the conductive layers into individual capacitor plates (similar to processing described above with respect to FIGS. 19 and 26).

Figure 38:
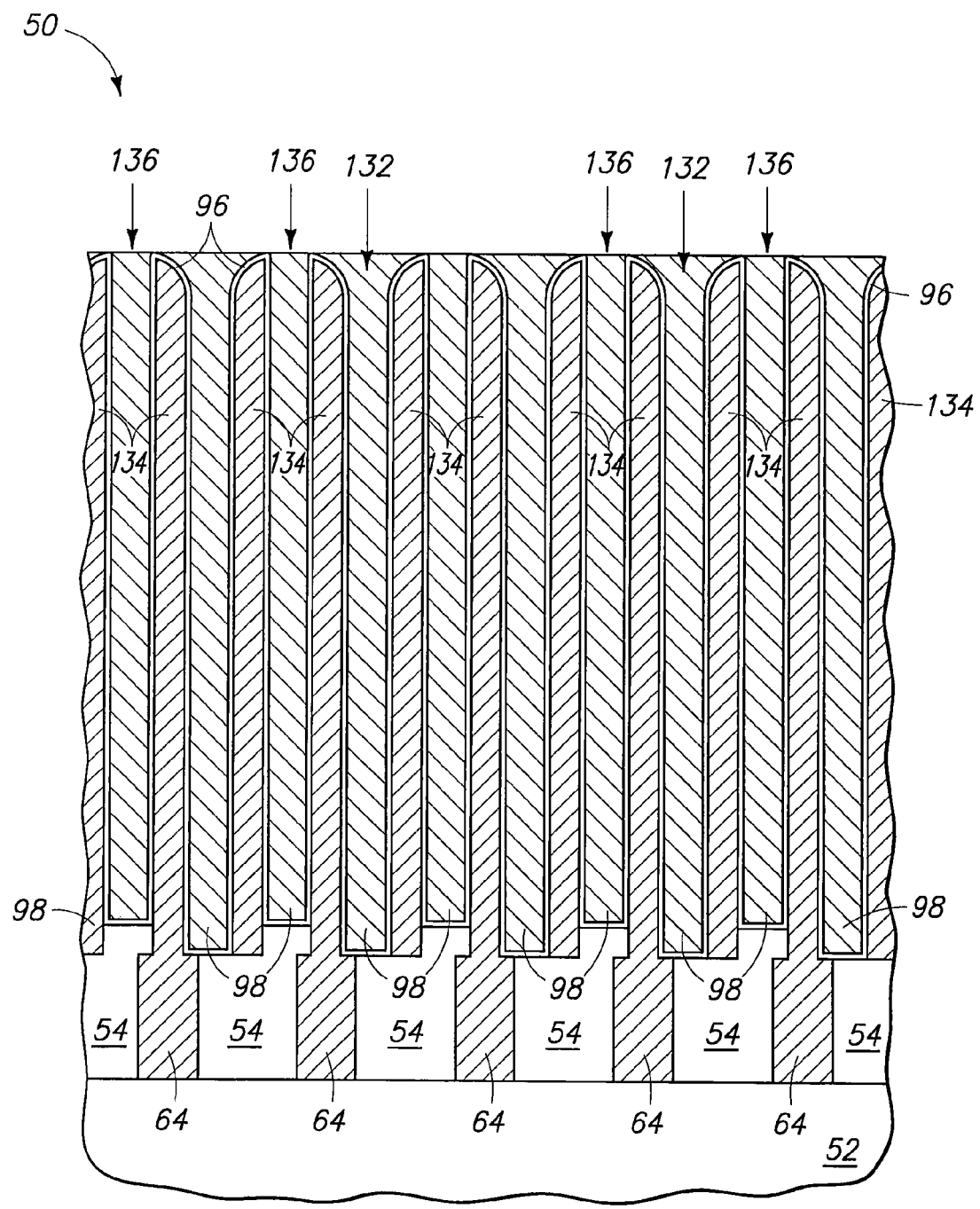
FIG. 38 is a view of the FIG. 3 wafer fragment at a processing stage subsequent to that of FIG. 37.

Referring to FIG. 38, after formation of individual capacitor bottom plates, insulative material(s) between the plates can be removed by, for example, wet isotropic etching, and a dielectric layer 96 can be formed over the individual plates. Cell poly material 98 can be deposited over the capacitor dielectric with subsequent masking and etching to remove cell poly from the periphery and to form separate cell plates as illustrated in FIG. 38.

Formation of double-pitched capacitors as herein described can allow formation of high capacitance storage plates while avoiding problematic masking and patterning events of conventional capacitor formation. The capacitors of the invention can be utilized in place of conventional type capacitors in memory cells, DRAM arrays and circuitry such as the exemplary circuitry depicted in FIGS. 1 and 2.

FIG. 39 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 40. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementations which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

Figure 41:
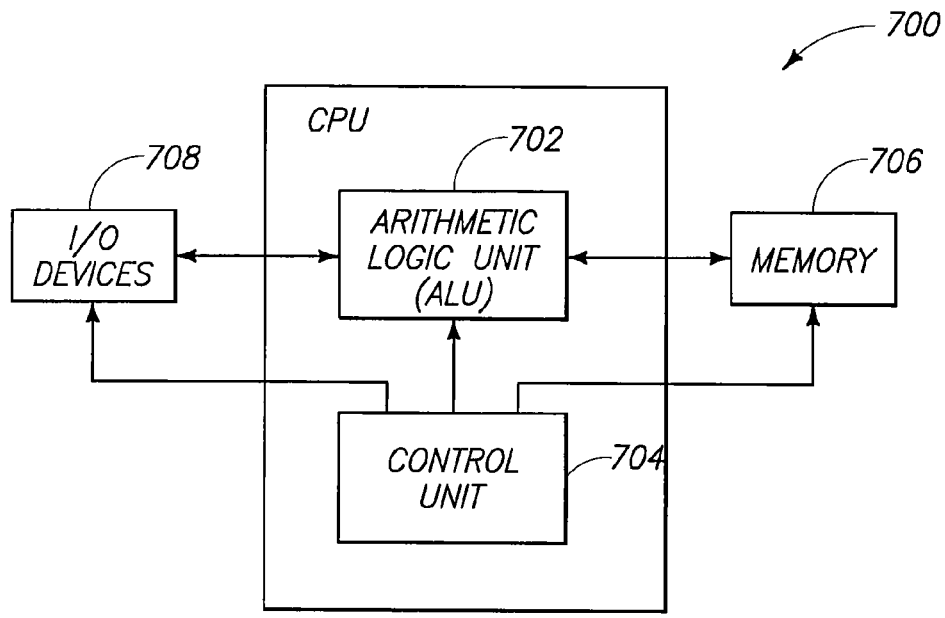
FIG. 41 is a high level block diagram of an electronic system according to an exemplary aspect of the present invention.

FIG. 41 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

Figure 42:
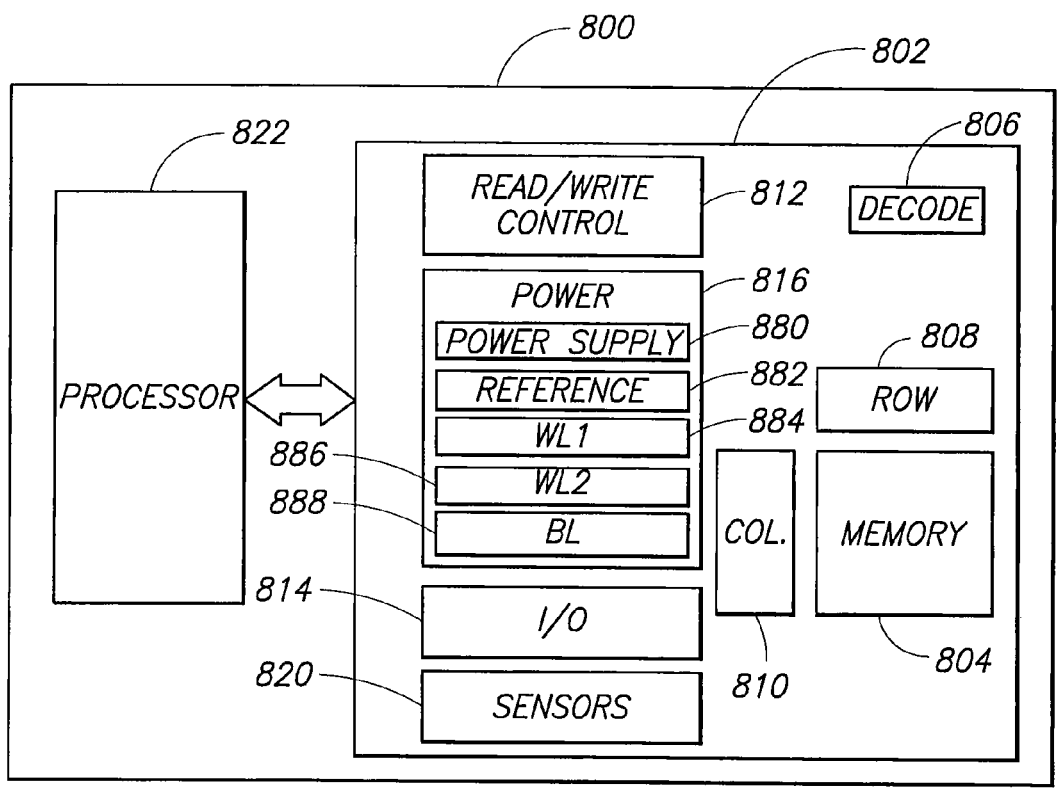
FIG. 42 is a simplified block diagram of an exemplary memory device according to an aspect of the present invention.

FIG. 42 is a simplified block diagram of a high-level organization of various embodiments of an exemplary electronic system 800. The system 800 includes a memory device 802 that has an array of memory cells 804, address decoder 806, row access circuitry 808, column access circuitry 81 0, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

It is noted that relative elevational relationships are utilized to describe the locations of various features to one another (e.g., upward, downward, etc are utilized) within this disclosure. It is to be understood that such terms are used to express relative relations between the components only, and not to indicate a relationship of the components relative to an external frame of reference. Thus, for example, a feature described herein as projecting upwardly relative to another feature may in fact appear to extend downwardly to a viewer in an external frame of reference relative to the feature.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A DRAM array comprising:
a first row of contact plugs, a midpoint to midpoint distance between adjacent plugs within the first row defining a plug pitch;
a second row of contact plugs spaced from the first row of contact plugs by a first gap distance;
a third row of contact plugs spaced from the second row of contact plugs by a second gap distance, the second gap distance being greater than the first gap distance;
a first plurality of six-sided bottom plates, each bottom plate comprised by the first plurality being orthogonal relative to the plug rows and in electrical contact with a single contact plug and spanning the second distance, the single contact plug being within the second row of contact plugs; and
a second plurality of bottom plates, each of the bottom plates comprised by the second plurality being in electrical contact with a single contact plug in the third row and spanning the second gap distance and being disposed between two bottom plates comprised by the first plurality, a plate pitch between adjacent plates being equivalent to half the plug pitch.

2. The DRAM array of claim 1 wherein the contact plugs comprised by the third row are offset one half pitch in the first direction relative to the contact plugs comprised by the second row.

3. The DRAM array of claim 1 wherein the bottom plates comprise polysilicon.

4. The DRAM array of claim 1 wherein the bottom plates comprise TiN.

5. The DRAM array of claim 1 further comprising an insulative support structure spanning a distance between adjacent bottom plates.

6. The DRAM array of claim 5 wherein each contact plug has an upper surface and wherein each bottom plate extends vertically upward to a first elevation relative to the upper surface, the insulative support structures being disposed at a second elevation between the upper surface and the first elevation.

7. An electronic system comprising:
a processor; and
a memory device operably associated with the processor, the memory device having a memory array comprising:
a first row of contact plugs having a plug pitch defined by a distance measured midpoint to midpoint between two adjacent plugs;
a second row of contact plugs spaced from the first row of contact plugs by a first gap distance;
a third row of contact plugs spaced from the second row of contact plugs by a second gap distance which is greater than the first gap distance; and
a plurality of six-sided bottom capacitor plates spanning the second gap distance and being orthogonal to the plug rows, each contact plug comprised by the second row being electrically connected to a single of the six-sided bottom capacitor plates comprised by the plurality of six-sided bottom capacitor plates.

8. The electronic system of claim 7 wherein the plurality of six-sided bottom capacitor plates is a first plurality, and further comprising a second plurality of six-sided bottom capacitor plates spanning the second distance, each contact plugs comprised by the third row being electrically connected to a single of the six-sided bottom capacitor plates comprised by the second plurality of six-sided bottom capacitor plates.

9. The electronic system of claim 8 wherein the bottom plates comprised by the first and second pluralities of bottom plates are substantially parallel relative to each other.

10. The electronic system of claim 8 wherein each of the bottom plates comprised by the first plurality is disposed between two adjacent bottom plates comprised by the second plurality.

11. The electronic system of claim 8 wherein the first and second pluralities of bottom plates are aligned within a single row of bottom plates, the plates being disposed at a plate pitch relative to adjacent bottom plates; and wherein the plugs within each of the individual rows of plugs is disposed at a plug pitch relative to other plugs within the row, the plug pitch being approximately double the plate pitch.

* * * * *